US009985128B2

(12) United States Patent
Ohoka et al.

(10) Patent No.: US 9,985,128 B2
(45) Date of Patent: May 29, 2018

(54) SEMICONDUCTOR DEVICE

(71) Applicant: Panasonic Intellectual Property Management Co., Ltd., Osaka (JP)

(72) Inventors: Atsushi Ohoka, Kyoto (JP); Osamu Kusumoto, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/667,895

(22) Filed: Aug. 3, 2017

(65) Prior Publication Data

US 2018/0061980 A1    Mar. 1, 2018

(30) Foreign Application Priority Data

Sep. 1, 2016   (JP) .................................. 2016-171013

(51) Int. Cl.
*H01L 29/06*      (2006.01)
*H01L 29/78*      (2006.01)
(Continued)

(52) U.S. Cl.
CPC ...... *H01L 29/7815* (2013.01); *H01L 29/0646* (2013.01); *H01L 29/0684* (2013.01); *H01L 29/0696* (2013.01); *H01L 29/0865* (2013.01); *H01L 29/1095* (2013.01); *H01L 29/1608* (2013.01); *H01L 29/26* (2013.01); *H01L 29/41741* (2013.01); *H01L 29/66068* (2013.01); *H01L 29/66712* (2013.01); *H01L 21/0243* (2013.01); *H01L 21/02378* (2013.01); *H01L 21/02433* (2013.01); *H01L 21/02529* (2013.01);
(Continued)

(58) Field of Classification Search
CPC ........... H01L 21/823481; H01L 27/085; H01L 29/0619
USPC ........................................................ 257/544
See application file for complete search history.

(56) References Cited

U.S. PATENT DOCUMENTS 5,559,355 A  *  9/1996  Yamazaki ........... H01L 27/0248
                                                         257/135
2012/0211833 A1*  8/2012  Tamura ............... H01L 29/7815
                                                         257/339
(Continued)

OTHER PUBLICATIONS

A. Furukawa et al, "Low On-Resistance 1.2kV 4H-SiC MOSFETs Integrated with Current Sensor", 2011 IEEE 23rd International Symposium on Power Semiconductor Devices & IC's (US), May 2011, p. 288-291, DOI:10.1109/ISPSD.2011.5890847.

*Primary Examiner* — George Fourson, III
(74) *Attorney, Agent, or Firm* — McDermott Will & Emery LLP

(57) ABSTRACT

A semiconductor device including a main region, a sense region, a separation region electrically isolating the main and sense region regions includes a first semiconductor layer positioned on the main surface of a semiconductor substrate, a plurality of main cells disposed in the main region, and a plurality of sense cells disposed in the sense region. Source regions of the main cell become conductive with a source electrode and source regions of the sense cell become conductive with a sense electrode. The separation region includes a plurality of second conductivity type separation body regions and a barrier region and is disposed within a first semiconductor layer and is disposed to abut on the surface of the first semiconductor layer.

18 Claims, 21 Drawing Sheets

(51) Int. Cl.
*H01L 29/417* (2006.01)
*H01L 29/10* (2006.01)
*H01L 29/08* (2006.01)
*H01L 29/26* (2006.01)
*H01L 29/16* (2006.01)
*H01L 29/66* (2006.01)
H01L 21/02 (2006.01)
H01L 21/04 (2006.01)
H01L 29/167 (2006.01)
H01L 21/8234 (2006.01)
H01L 27/085 (2006.01)

(52) U.S. Cl.
CPC ...... *H01L 21/02634* (2013.01); *H01L 21/046* (2013.01); *H01L 21/0465* (2013.01); *H01L 21/823481* (2013.01); *H01L 27/085* (2013.01); *H01L 29/0619* (2013.01); *H01L 29/167* (2013.01); *H01L 29/7811* (2013.01)

(56) References Cited

U.S. PATENT DOCUMENTS

2016/0211361 A1* 7/2016 Nishimura .......... H01L 29/7805
2017/0111037 A1* 4/2017 Shiigi ................. H01L 21/4853
2017/0262118 A1* 9/2017 Meng .................... G06F 3/0416

\* cited by examiner

SEMICONDUCTOR DEVICE

BACKGROUND

1. Technical Field

The present disclosure is related to a semiconductor device.

2. Description of the Related Art

A configuration of a semiconductor device, such as a metal-insulator-semiconductor field-effect transistor (MISFET), in which a current sensing function for detecting the load current is provided in order to prevent overcurrent flow through the semiconductor device, is known. In the present specification, a semiconductor device provided with the current sensing function is referred to as a "device with current sensing". The device with current sensing has a main region and a sense region which allows a portion of the load current flowing to the semiconductor device to be branched.

FIG. 19 is a schematic diagram for explaining an equivalent circuit of a device with current sensing. Device with current sensing 1000 includes main region 1020 and sense region 1021. A plurality of main cells connected in parallel to each other is disposed in main region 1020. A plurality of sense cells connected in parallel to each other is disposed in sense region 1021. The main cells are connected to common source electrode 1014 and the sense cells are connected to common sense electrode 1015. For example, source electrode 1014 is grounded. Sense electrode 1015 can be connected to, for example, a protection circuit against the overcurrent. A gate electrode and a drain electrode of the sense cell are in common with the gate electrode and the drain electrode of the main cell. In device with current sensing 1000, current $I_{main}$ flowing in the main region is referred to as a "main current" and current $I_{sense}$ flowing in the sense region is referred to as a "sense current".

The sense cell normally has the same structure as that of the main cell. However, the number of sense cells connected in parallel is smaller than the number of main cells connected in parallel. In such a configuration, the ratio of main current $I_{main}$ and sense current $I_{sense}$ coincides with the ratio of the number of main cells connected in parallel in main region 1020 and the number of sense cells connected in parallel in sense region 1021. The number of cells of each region may be set in such a way that sense current $I_{sense}$ becomes, for example, $1/1000$ to $1/10000$ of main current $I_{main}$.

When the device with current sensing is used, main current $I_{main}$ can be predicted using sense current $I_{sense}$ and thus, it becomes possible to detect the overcurrent flowing through the main region. Device with current sensing 1000 can be preferably applied to intelligent power module (IPM) or the like, which incorporates an overcurrent protection circuit, or the like.

However, in device with current sensing 1000, a leakage current $I_{leak}$ (in the following, referred to as a "leakage current between main and sense region") may be generated between source electrode 1014 electrically connected to the main cell and sense electrode 1015 electrically connected to the sense cell. When the leakage current between main and sense region is generated, detection accuracy of sense current $I_{sense}$ deteriorates such that it becomes difficult to detect main current $I_{main}$ with high accuracy. For that reason, a configuration for reducing leakage current $I_{leak}$ between main and sense region is proposed.

In NPL 1, a device with current sensing using silicon carbide (SiC) is disclosed. In NPL 1, in order to reduce the leakage current between main and sense region, a body region which is in a floating state is disposed in a region positioned between the main region and the sense region (in the following, referred to as a "separation region"). A gate insulating film is formed below a gate electrode of the separation region with a thickness thicker than that of below the gate electrodes of the main region and the sense region.

CITATION LIST

Non-Patent Literature

NPL 1: A. Furukawa, et al., "2011 IEEE 23rd International Symposium on Power Semiconductor Devices and ICs" (US), May 2011, p. 288-291, DOI: 10.1109/ISPSD.2011.5890847

SUMMARY

The present inventors investigate physical mechanisms by which a leakage current between main and sense region is generated in detail and examine a new structure capable of reducing the leakage current between the source electrode and the sense electrode based on the results of the investigation.

An exemplary embodiment in the present specification which is not limited but illustrative provides a semiconductor device equipped with a current sensing function with which a load current can be detected with high accuracy.

According to one aspect of the present disclosure, there is provided a semiconductor device that includes a main region, a sense region, and a separation region electrically isolating the main region and the sense region, the semiconductor device including a first conductivity type semiconductor substrate, a first semiconductor layer, a plurality of main cells, a plurality of sense cells, a source electrode, and a sense electrode. The first semiconductor layer is positioned on the main surface of the semiconductor substrate. The plurality of main cells is disposed in the main region of the semiconductor substrate and is connected in parallel to each other. The plurality of sense cells is disposed in the sense region of the semiconductor substrate and is connected in parallel to each other. At least a portion of the source electrode is disposed in the main region. At least a portion of the sense electrode is disposed in the sense region. Each of the plurality of main cells and each of the plurality of sense cells include a second conductivity type body region, a first conductivity type source region, a first conductivity type drift region, a gate insulating film, a gate electrode, and a drain electrode. The body region is disposed within the first semiconductor layer and abuts the main surface of the first semiconductor layer. The source region is positioned within the body region. The drift region is disposed in a region other than the body region and a region other than the source region, among the first semiconductor layer. The gate insulating film is disposed on the first semiconductor layer. The gate electrode is disposed on the gate insulating film. The drain electrode is disposed on the back surface of the semiconductor substrate. The source region included in each of the plurality of main cells is electrically connected to the source electrode. The source region included in each of the plurality of sense cells is electrically connected to the sense electrode. The separation region includes a plurality of separation body regions and barrier regions. Each of the plurality of separation body regions has a second conductivity type and is disposed within the first semiconductor layer, and abuts the main surface of the first semiconductor layer. The plurality of separation body regions include a first separation body region electrically connected to the source electrode and a second separation body region electrically connected to the sense electrode. The barrier region is disposed between two adjacent separation body regions among the plurality of separation body regions, within the first semiconductor layer and abuts the main surface of the first semiconductor layer. The barrier region contains first conductivity type impurities with a concentration higher than that of the drift region.

According to another aspect of the present disclosure, there is provided a semiconductor device that includes a main region, a sense region, and a separation region electrically isolating the main region and the sense region, the semiconductor device including a first conductivity type semiconductor substrate, a first semiconductor layer, a plurality of main cells, a plurality of sense cells, a source electrode, and a sense electrode. The first semiconductor layer is positioned on the main surface of the semiconductor substrate. The plurality of main cells is disposed in the main region of the semiconductor substrate and is connected in parallel to each other. The plurality of sense cells is disposed in the sense region of the semiconductor substrate and is connected in parallel to each other. At least a portion of the source electrode is disposed in the main region. At least a portion of the sense electrode is disposed in the sense region. Each of the plurality of main cells and each of the plurality of sense cells include a second conductivity type body region, a first conductivity type source region, a first conductivity type drift region, a first conductivity type channel layer, a gate insulating film, a gate electrode, and a drain electrode. The body region is disposed within the first semiconductor layer and abuts the main surface of the first semiconductor layer. The source region is positioned within the body region. The drift region is disposed in a region other than the body region and a region other than the source region among the first semiconductor layer. The channel layer is disposed to abut at least the body region on the first semiconductor layer. The gate insulating film is disposed on the second channel layer. The gate electrode is disposed on the gate insulating film. The drain electrode is disposed on the back surface of the semiconductor substrate. The source region of the main cell is electrically connected to the source electrode. The source region of the sense cell is electrically connected to the sense electrode. The separation region includes a plurality of separation body regions each of which contains second conductivity type impurities, a first conductivity type region, and a highly-impurity-concentrated first conductivity type semiconductor layer containing first conductivity type impurities with a concentration higher than that of the first conductivity type region. The separation body region is disposed within the first semiconductor layer and abuts the main surface of the first semiconductor layer. The separation body region includes a first separation body region electrically connected to the source electrode and a second separation body region electrically connected to the sense electrode. The first conductivity type region is positioned between two adjacent separation body regions among the plurality of separation body regions. The highly-impurity-concentrated first conductivity type semiconductor layer is disposed on the first conductivity type region.

The semiconductor device disclosed in the present specification is a semiconductor device equipped with a current sensing function with which a load current can be detected with high accuracy.

DETAILED DESCRIPTION

Figure 1A:
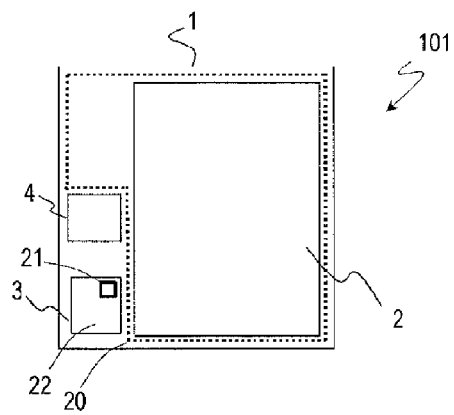
FIG. 1A is a schematic plan view illustrating a semiconductor device according to a first exemplary embodiment.

Knowledge on the basis of the present exemplary embodiment is as follows.

The present inventors investigate mechanisms by which a leakage current between main and sense region is generated in detail in a device with current sensing function. As a result of the investigation, the present inventors found out that punch-through of the parasitic bipolar transistor formed in the separation region is the main factor causing leakage current between main and sense region. This matter is a new knowledge distinct from conventional technology. Detailed investigation results will be described later.

The present inventors found out a new configuration in which the leakage current between main and sense region can be reduced and arrived at a semiconductor device of the present disclosure.

The outline of the semiconductor device of the present disclosure is as follows.

According to one aspect of the present disclosure, there is provided a semiconductor device that includes a main region, a sense region, and a separation region electrically isolating the main region and the sense region, the semiconductor device including a first conductivity type semiconductor substrate, a first semiconductor layer, a plurality of main cells, a plurality of sense cells, a source electrode, and a sense electrode. The first semiconductor layer is positioned on the main surface of the semiconductor substrate. The main cells are disposed in the main region of semiconductor substrate and are connected in parallel to each other. The sense cells are disposed in the sense region of the semiconductor substrate and are connected in parallel to each other. At least a portion of the source electrode is disposed in the main region. At least a portion of the sense electrode is disposed in the sense region. Each of the plurality of main cells and each of the plurality of sense cells include a second conductivity type body region, a first conductivity type source region, a first conductivity type drift region, a gate insulating film, a gate electrode, and a drain electrode. The body region is disposed within the first semiconductor layer and abuts the main surface of the first semiconductor layer. The source region is positioned within the body region. The drift region is disposed in a region other than the body region and a region other than the source region among the first semiconductor layer. The gate insulating film is disposed on the first semiconductor layer. The gate electrode is disposed on the gate insulating film. The drain electrode is disposed on the back surface of the semiconductor substrate. The source region of the main cell is electrically connected to the source electrode. The source region of the sense cell is electrically connected to the sense electrode. The separation region includes a plurality of second conductivity type separation body regions and a barrier region. The separation body region is disposed within the first semiconductor layer and abuts the main surface of the first semiconductor layer. The separation body region includes a first separation body region electrically connected to the source electrode and a second separation body region electrically connected to the sense electrode. The barrier region is disposed between two adjacent separation body regions among the plurality of separation body regions, within the first semiconductor layer. The barrier region contains first conductivity type impurities with a concentration higher than that of the drift region.

The semiconductor device may further include, for example, a highly-impurity-concentrated first conductivity type semiconductor layer which is on the first semiconductor layer and is disposed to abut at least a portion of the barrier region. The highly-impurity-concentrated first conductivity type semiconductor layer may contain first conductivity type impurities with a concentration higher than that of the drift region.

In the semiconductor device, an impurity concentration of the barrier region may be, for example, greater than or equal to $1\times10^{16}$ cm$^{-3}$ and less than or equal to $1\times10^{18}$ cm$^{-3}$.

In the semiconductor device, when viewed from a normal direction to the main surface of the semiconductor substrate, the barrier region may be positioned closer to the sense region than the main region.

The semiconductor device may further include a JFET region disposed between the body regions in two adjacent sense cells among the plurality of sense cells and between the body regions in two adjacent main cells among the plurality of main cells. Concentration profiles of the first conductivity type impurities of the JFET region and the barrier region in the depth direction may be equal to each other.

In the semiconductor device, when viewed from the normal direction to the main surface of the semiconductor substrate, the plurality of sense cells and the plurality of main cells may be two-dimensionally arranged in a first direction and a second direction intersecting with the first direction. The semiconductor device may include, for example, a plurality of cell rows arranged in the second direction. Each of the plurality of cell rows may include a main cell row consisting of main cells arranged in the first direction, a sense cell row consisting of sense cells arranged in the first direction, and a first separation body region, a barrier region, and a second separation body region that are positioned between the main cell and the sense cell.

In the semiconductor device, the plurality of cell rows may include the first cell row and the second cell row that are adjacent to each other in the second direction. The barrier region may include, for example, first portions respectively disposed within the first cell row and the second cell row and a second portion disposed between the first cell row and the second cell row and connecting the first portion of the first cell row and the first portion of the second cell row.

In the semiconductor device, the plurality of separation body regions may further include, for example, at least one third separation body region disposed between the first separation body region and the second separation body region. The separation region may further include, for example, another barrier region. In each of the plurality of cell rows, the barrier region and the other barrier region may be disposed between the main cell row and the sense cell row by sandwiching at least one third separation body region between the barrier regions.

In the semiconductor device, the plurality of cell rows may include the first cell row and the second cell row that are adjacent to each other in the second direction. The barrier region may include, for example, first portions respectively disposed within the first cell row and the second cell row and a third portion disposed between the first cell row and the second cell row and connecting the first portion of the first cell row and the other barrier region.

In the semiconductor device, when viewed from the normal direction to the main surface of the semiconductor substrate, the barrier region may be disposed to surround, for example, at least one of the pluralities of separation body regions.

According to another aspect of the present disclosure, there is provided a semiconductor device that includes a main region, a sense region, and a separation region electrically isolating the main region and the sense region, the semiconductor device including a first conductivity type semiconductor substrate, a first semiconductor layer, a plurality of main cells, a plurality of sense cells, a source electrode, and a sense electrode. The first semiconductor layer is positioned on the main surface of the semiconductor substrate. The plurality of main cells is respectively disposed in the main region of the semiconductor substrate and is connected in parallel to each other. The plurality of sense cells is respectively disposed in the sense region of semiconductor substrate and is connected in parallel to each other. At least a portion of the source electrode is disposed in the main region. At least a portion of the sense electrode is disposed in the sense region. Each of the plurality of main cells and each of the plurality of sense cells include a second conductivity type body region, a first conductivity type source region, a first conductivity type drift region, a first conductivity type channel layer, a gate insulating film, a gate electrode, and a drain electrode. The body region is disposed within the first semiconductor layer and abuts the main surface of the first semiconductor layer. The source region is positioned within the body region. The drift region is disposed in a region other than the body region and a region other than the source region among the first semiconductor layer. The channel layer is disposed to abut at least the body region on the first semiconductor layer. The gate insulating film is disposed on the second channel layer. The gate electrode is disposed on the gate insulating film. The drain electrode is disposed on the back surface of the semiconductor substrate. The source region of the main cell is electrically connected to the source electrode. The source region of the sense cell is electrically connected to the sense electrode. The separation region includes a plurality of separation body regions each of which has contains second conductivity type impurities, a first conductivity type region, and a highly-impurity-concentrated first conductivity type semiconductor layer. The separation body region is disposed within the first semiconductor layer and abuts the main surface of the first semiconductor layer. The separation body region includes a first separation body region electrically connected to the source electrode and a second separation body region electrically connected to the sense electrode. The first conductivity type region is positioned between two adjacent separation body regions among the plurality of separation body regions. The highly-impurity-concentrated first conductivity type semiconductor layer is disposed on the first conductivity type region and contains first conductivity type impurities with a concentration higher than that of the first conductivity type region.

In the semiconductor device, the impurity concentration of the highly-impurity-concentrated first conductivity type semiconductor layer may be, for example, greater than or equal to $1\times10^{17}$ cm$^{-3}$ and less than or equal to $1\times10^{19}$ cm$^{-3}$.

In the semiconductor device, the highly-impurity-concentrated first conductivity type semiconductor layer and the channel layer may be connected to each other to constitute a second semiconductor layer.

In the semiconductor device, the concentration profile of the second conductivity type impurities of the body region in a depth direction may be equal to the concentration profile of the second conductivity type impurities of the separation body region in a depth direction.

In the semiconductor device, the first semiconductor layer may be a silicon carbide semiconductor layer.

In the following, an exemplary embodiment of the present disclosure will be described with reference to the accompanying drawings.

First Exemplary Embodiment

Structure of Semiconductor Device

A semiconductor device of the present exemplary embodiment includes a plurality of unit cells. Here, description will be made for a silicon carbide semiconductor device of which the unit cell is a MISFET as an example. The semiconductor device of the present exemplary embodiment may be a device using semiconductor other than silicon carbide. For example, the semiconductor device may be a silicon semiconductor device. Each unit cell is not limited to the MISFET and may be, for example, an insulated gate bipolar transistor (IGBT), a junction field-effect transistor (JFET), or the like.

FIG. 1A is a schematic plan view illustrating semiconductor device 101 according to the first exemplary embodiment.

As illustrated in FIG. 1A, semiconductor device 101 includes semiconductor substrate 1 and a plurality of unit cells (not illustrated) supported on semiconductor substrate 1. On the main surface of the semiconductor substrate 1, source pad 2, sense pad 3, and gate pad 4 are provided above the plurality of unit cells. Source pad 2, sense pad 3, and gate pad 4 are electrically insulated from each other. Each pad may be divided into a plurality of portions electrically connected to each other.

Semiconductor device 101 includes sense region 21 and main region 20. A plurality of unit cells is disposed in each sense region 21 and main region 20. Among the unit cells, unit cells disposed in main region 20 and sense region 21 are referred to as main cells and sense cells, respectively. The plurality of main cells within main region 20 is connected in parallel to each other. The plurality of sense cells within sense region 21 is connected in parallel to each other. The sense cell and the main cell may have the same cell structure.

When viewed from the normal direction to the semiconductor substrate 1, sense region 21 and sense pad 3 are disposed to overlap with each other. In this example, sense region 21 is smaller than sense pad 3 and is positioned at the corner portion of sense pad 3, close to the center of semiconductor substrate 1. On the other hand, main region 20 is disposed so that main region 20 overlaps source pad 2 and does not overlap with gate pad 4 or sense pad 3, when viewed from the normal direction to the semiconductor substrate 1.

An inactive cell (also referred to as a "dummy cell") which does not function as a transistor may be provided in a region other than sense region 21 and main region 20. For example, sense dummy cell region 22 in which a plurality of dummy cells are arranged may be disposed below sense pad 3.

Figure 1B:
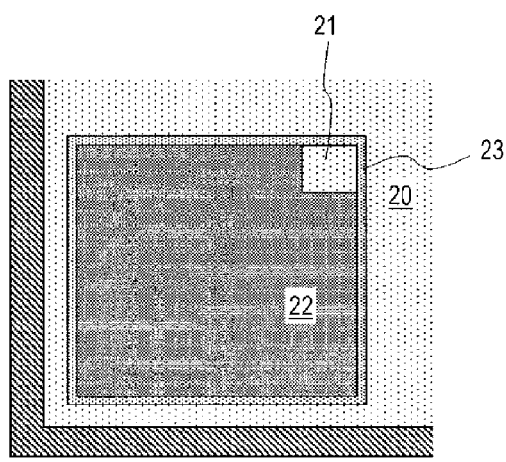
FIG. 1B is an enlarged plan view illustrating a boundary portion between a main region and a sense region in the semiconductor device.
Figure 1C:
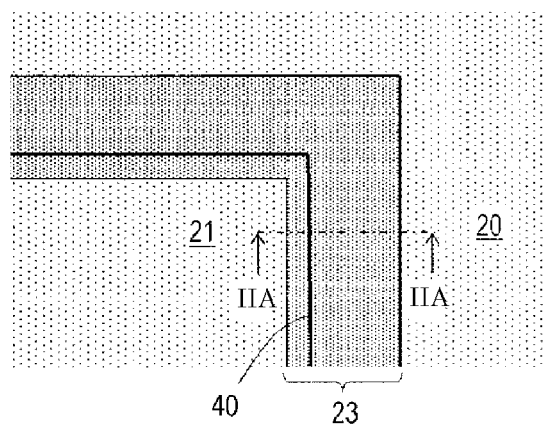
FIG. 1C is another enlarged plan view illustrating the boundary portion between the main region and the sense region in the semiconductor device.

Respective FIG. 1B and FIG. 1C are enlarged plan views illustrating a boundary portion between main region 20 and sense region 21 in semiconductor device 101. In order to make it easy to understand, source pad 2, sense pad 3, and gate pad 4 are not illustrated in FIG. 1B and FIG. 1C.

Separation region 23 is disposed between main region 20 and sense region 21 as illustrated in FIG. 1B and FIG. 1C. Separation region 23 electrically isolates the main cell and the sense cell from each other. In the present specification, separation region 23 indicates an entire region positioned between main region 20 and sense region 21. That is, separation region 23 is a region defined to be in between an end portion of the main cell positioned closest to sense region 21 and an end portion of the sense cell positioned closest to main region 20.

As illustrated in FIG. 1C, separation region 23 includes barrier region 40 which will be described later. In this example, when viewed from the normal direction to the semiconductor substrate 1, barrier region 40 extends along the peripheral edge of sense region 21. Barrier region 40 may be disposed to surround sense region 21 and sense dummy cell region 22.

Arrangement, a size, or the like of each pad, main region 20, sense region 21, sense dummy cell region 22, and separation region 23 are not limited to the examples illustrated in FIG. 1A to FIG. 1C. Although not illustrated, main region 20 may be disposed to surround sense region 21. For example, main region 20 may be disposed between a peripheral edge portion of semiconductor substrate 1 and sense pad 3. Another sense region and pad for detecting a voltage may be further provided.

Next, a structure of semiconductor device 101 will be more specifically described.

Figure 2A:
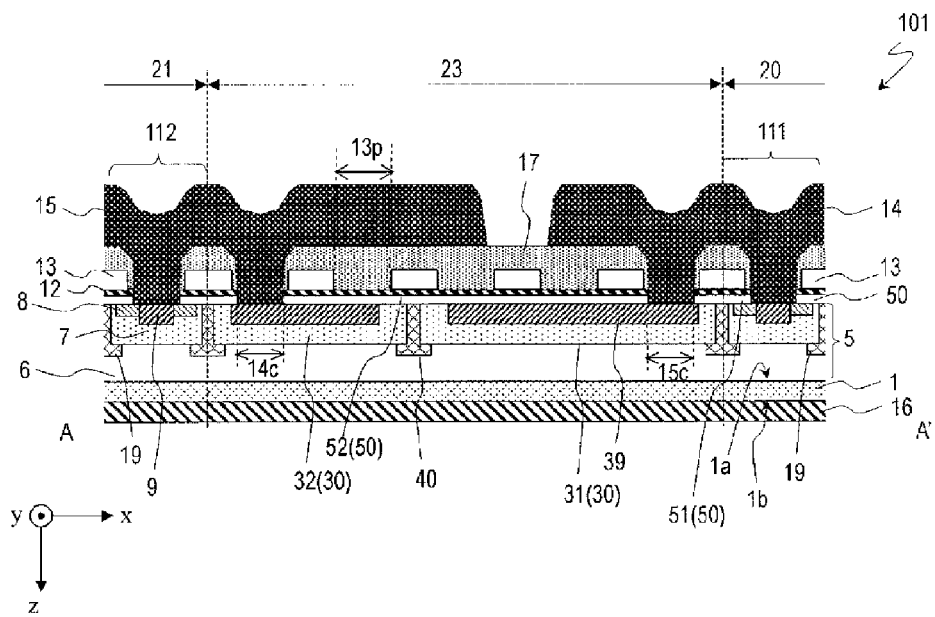
FIG. 2A is a schematic cross-sectional view of the main region, a separation region, and the sense region in the semiconductor device according to a first exemplary embodiment.

FIG. 2A is a schematic cross-sectional view of main region 20, separation region 23, and sense region 21 in semiconductor device 101. FIG. 2A illustrates a cross-sectional structure when taken along the cutline A-A' in FIG. 1C.

As illustrated in FIG. 2A, semiconductor device 101 includes first conductivity type semiconductor substrate 1 and first silicon carbide semiconductor layer 5 (also referred to as "first semiconductor layer") of a first conductivity type disposed on the main surface 1a of semiconductor substrate 1. First silicon carbide semiconductor layer 5 is, for example, a silicon carbide epitaxial layer. Drain electrode 16 is disposed on the back surface 1b of semiconductor substrate 1.

Plurality of main cells 111 is disposed in main region 20 and plurality of sense cells 112 is disposed in sense region 21. In FIG. 2A, single main cell 111 and single sense cell 112 are illustrated. Source electrode 14 common to plurality of main cells 111 is disposed in main region 20 and sense electrode 15 common to plurality of sense cells 112 is disposed in sense region 21.

Cross-Sectional Structure of Main cell 111 and Sense cell 112

Each of main cell 111 and sense cell 112 includes second conductivity type body region 7 (may be referred to as well region), first conductivity type source region 8, and first conductivity type drift region 6 within first silicon carbide semiconductor layer 5.

Body region 7 is disposed to abut the main surface of first silicon carbide semiconductor layer 5 within first silicon carbide semiconductor layer 5. Source region 8 contains first conductivity type impurities with a concentration higher than that of drift region 6. Source region 8 is disposed from the main surface of first silicon carbide semiconductor layer 5 toward the inside, within body region 7. Also, contact region 9 may be disposed from the main surface of first silicon carbide semiconductor layer 5 toward the inside in body region 7. Contact region 9 is a highly-impurity-concentrated second conductivity type region containing second conductivity type impurities with a concentration higher than that of body region 7. Drift region 6 is disposed in a region where body region 7, source region 8, and contact region 9 are not formed, among first silicon carbide semiconductor layer 5.

Each of main cell 111 and sense cell 112 further includes first conductivity type channel layer 51 disposed on first silicon carbide semiconductor layer 5. Channel layer 51 contains first conductivity type impurities with a concentration higher than that of drift region 6. In this example, although channel layer 51 is disposed over main region 20 and sense region 21, channel layer 51 may be disposed to abut at least the body region 7 of each main cell 111 and each sense cell 112. For example, channel layer 51 may be disposed to abut at least a portion of source region 8, body region 7, and a portion of drift region 6 (JFET region 19, which will be described later, in a case where JFET region 19 is formed). In the first exemplary embodiment, second silicon carbide semiconductor layer 50 is formed on the main surface of first silicon carbide semiconductor layer 5 and a portion positioned in main region 20 and sense region 21 among second silicon carbide semiconductor layer 50 functions as channel layer 51. Second silicon carbide semiconductor layer 50 (also referred to as "second semiconductor layer") is, for example, a silicon carbide epitaxial layer.

Gate electrode 13 is disposed on the channel layer 51 with gate insulating film 12 in between. Interlayer dielectric film 17 is provided on gate electrode 13 to cover main cell 111 and sense cell 112. Source electrode 14 and sense electrode 15 are disposed on interlayer dielectric film 17. Source region 8 of main cell 111 is electrically connected to source electrode 14. Source region 8 of sense cell 112 is electrically connected to sense electrode 15. In this example, source electrode 14 connects to source region 8 of each main cell 111 through an opening in interlayer dielectric film 17. Similarly, sense electrode 15 connects to source region 8 of each sense cell 112 through an opening in interlayer dielectric film 17. Although not illustrated, for example, a contact electrode containing silicide may be provided between source electrode 14, sense electrode 15, and first silicon carbide semiconductor layer 5. On the other hand, drain electrode 16 is disposed on the back surface 1b of semiconductor substrate 1.

Although not illustrated, source electrode 14 is electrically connected to each of source pad 2, sense electrode 15, and sense pad 3. Gate electrode 13 of main cell 111 and gate electrode 13 of sense cell 112 are electrically connected to each other and are electrically connected to gate pad 4.

A first conductivity type region is disposed between body regions 7 of two adjacent main cells 111 and between body regions 7 of two adjacent sense cells 112. The first conductivity type region is also disposed between body region 7 of main cell 111 or sense cell 112 and separation body region 30 which will be described later. The first conductivity type region may be drift region 6. Otherwise, as illustrated, JFET region 19, which contains first conductivity type impurities with a concentration higher than that of the drift region 6, may be disposed between body regions 7 as the first conductivity type region. JFET region 19 may be formed in at least a portion of a region positioned between two adjacent body regions 7.

As such, main cell 111 and sense cell 112 operate as, for example, a normally-off type MISFET. When a voltage greater than or equal to a threshold voltage is applied to gate electrode 13 in a state where a voltage is applied between source and drain, current can flow through channel layer 51 positioned below gate electrode 13. Accordingly, the drain current flows from drain electrode 16 to source electrode 14 or sense electrode 15 through semiconductor substrate 1, drift region 6, JFET region 19, channel layer 51, and source region 8 (ON state).

Cross-Sectional Structure of Separation Region 23

Plurality of second conductivity type separation body regions 30 is discretely disposed within first silicon carbide semiconductor layer 5 in separation region 23. One of plurality of separation body regions 30 is electrically connected to source electrode 14 and another one thereof is electrically connected to sense electrode 15. In the present specification, a region connected to source electrode 14 is referred to as "first separation body region" 31 and a region connected to sense electrode 15 is referred to as "second separation body region" 32, among separation body regions 30. In this example, source electrode 14 is connected to first separation body region 31 through an opening in interlayer dielectric film 17. Similarly, sense electrode 15 is connected to second separation body region 32 through an opening provided in interlayer dielectric film 17. Accordingly, first separation body region 31 has the same potential as that of source region 8 of main cell 111 and second separation body region 32 has the same potential as that of source region 8 of sense cell 112.

Contact region 39 may be disposed to abut the surface of separation body region 30 within separation body region 30. Contact region 39 is a highly-impurity-concentrated second conductivity type region containing second conductivity type impurities with a concentration higher than that of separation body region 30.

Barrier region 40 having a first conductivity type is disposed from the main surface of first silicon carbide semiconductor layer 5 toward the inside between two adjacent separation body regions 30 among plurality of separation body regions 30, within first silicon carbide semiconductor layer 5. Barrier region 40 is a highly-impurity-concentrated first conductivity type region containing first conductivity type impurities with a concentration higher than that of drift region 6. In this example, first separation body region 31 and second separation body region 32 are adjacent to each other and barrier region 40 is formed between the separation body regions 30. Barrier region 40 and separation body regions 30 at both sides of barrier region 40 constitute a parasitic bipolar transistor. Barrier region 40 may be disposed to abut the two separation body regions 30 at both sides of barrier region 40. Barrier region 40 may be disposed to be deeper than separation body region 30 and disposed over separation body region 30 in a thickness direction of separation body region 30.

One or a plurality of separation body regions may be further disposed between first separation body region 31 and second separation body region 32. In this case, barrier region 40 may be disposed in all spacing between adjacent separation body regions 30 or disposed in at least one spacing among all spacing, between first separation body region 31 and second separation body region 32.

Barrier region 40 does not necessarily abut the separation body regions 30 positioned at both sides thereof and drift region 6 may be positioned between barrier region 40 and separation body regions 30. In this case, a parasitic bipolar transistor is configured by a first conductivity type region including barrier region 40 and drift region 6 and the separation body regions 30.

Highly-impurity-concentrated first conductivity type semiconductor layer 52, which contains first conductivity type impurities with a concentration higher than that of drift region 6, is disposed on first silicon carbide semiconductor layer 5. In this example, highly-impurity-concentrated first conductivity type semiconductor layer 52 is formed over separation region 23. Highly-impurity-concentrated first conductivity type semiconductor layer 52 may be disposed in at least a portion of barrier region 40. For example, highly-impurity-concentrated first conductivity type semiconductor layer 52 may be disposed to abut barrier region 40 and edges of separation body regions 30 adjacent to the barrier region 40. Second silicon carbide semiconductor layer 50 may also be extended to separation region 23 to use a portion of second silicon carbide semiconductor layer 50 as highly-impurity-concentrated first conductivity type semiconductor layer 52. In this case, channel layer 51 and highly-impurity-concentrated first conductivity type semiconductor layer 52 may be connected to or separated from each other.

Gate insulating film 12 is extended on highly-impurity-concentrated first conductivity type semiconductor layer 52. Gate electrode 13 may be disposed on gate insulating film 12. In an example indicated in the figure, gate electrode 13 is provided on barrier region 40 and on edges of separation body regions 30 adjacent to the barrier region 40 with gate insulating film 12 in between.

Gate electrode 13 disposed in separation region 23 and gate electrodes 13 of main cell 111 and sense cell 112 may be integrally formed using the same conductive film. In this case, a layer including a plurality of gate electrodes 13 that are integrally formed is referred to as a "gate layer". The gate layer includes a plurality of openings 13*p* and the gate layer where openings 13*p* are not formed functions as gate electrode 13. Each opening 13*p* of the gate layer is disposed to overlap a portion of body region 7 in main region 20 and sense region 21. Each opening 13*p* of the gate layer are disposed to overlap separation body region 30 in separation region 23.

In the first exemplary embodiment, a source region is not provided within separation body region 30. When the source region is disposed, large current flow may occur due to the parasitic bipolar transistor constituted from the source region, separation body region 30, and barrier region 40, and semiconductor device 101 may be severely damaged. Especially, in a case where a length of separation body region 30 in the x-direction is greater than, for example, a width of body regions 7 of main cell 111 and sense cell 112, the source region is preferably not provided within separation body region 30. This is because the longer the length of separation body region 30 in the x-direction, the larger the resistance of separation body region 30 and the easier the parasitic bipolar transistor turns to ON state.

Separation body region 30 may be formed by the same ion implantation process as body region 7 of main cell 111 and sense cell 112. In this case, concentration profiles of the second conductivity type impurities in the depth directions of body region 7 and separation body region 30 become substantially identical to each other. Similarly, contact region 39 and contact region 9 are also formed by the same ion implantation process and may have substantially identical concentration profile of the second conductivity type impurities in the depth direction. Furthermore, barrier region 40 may be formed by the same ion implantation process as JFET region 19. In this case, concentration profiles of the first conductivity type impurities become substantially identical to each other in the depth directions of barrier region 40 and JFET region 19.

Planar Structure of Semiconductor Device 101

Figure 2B:
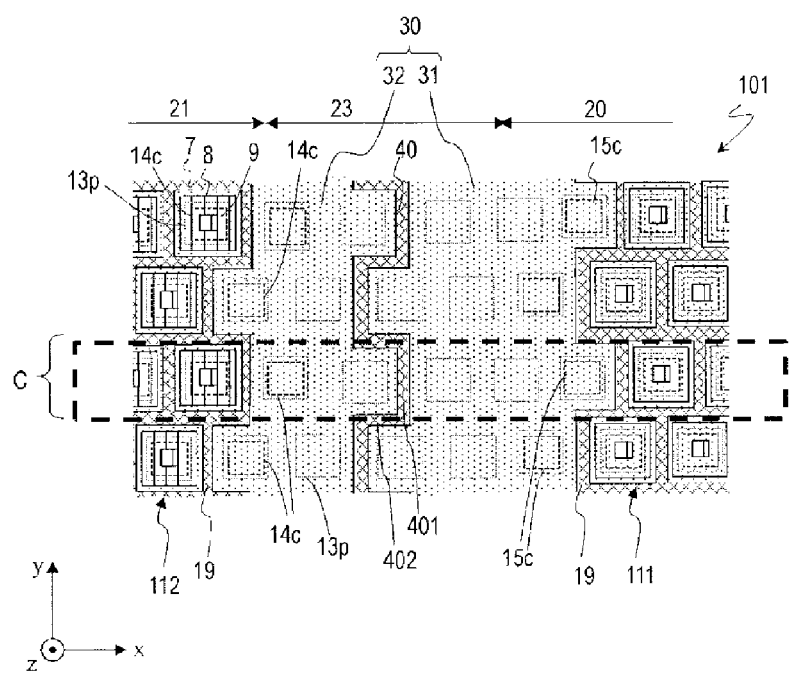
FIG. 2B is an enlarged plan view illustrating a portion of the semiconductor device and is a view illustrating a surface of a first silicon carbide semiconductor layer in the main region, the separation region, and the sense region.

FIG. 2B is an enlarged plan view illustrating a portion of semiconductor device 101, and illustrates the surface of first silicon carbide semiconductor layer 5 in main region 20, separation region 23, and the sense region 21.

When viewed from the normal direction to semiconductor substrate 1, body regions 7 of main cells 111 and sense cells 112 are discretely disposed in main region 20 and sense region 21, respectively. Body region 7 is, for example, rectangular. Source region 8 and contact region 9 are disposed within body region 7. JFET region 19 is disposed in a portion positioned between adjacent body regions 7 among main region 20 and sense region 21. On the other hand, barrier region 40, first separation body region 31, and second separation body region 32 are disposed in separation region 23. First separation body region 31 is disposed in the main cell 111 side of barrier region 40 and second separation body region 32 is disposed in the sense cell 112 side of barrier region 40. JFET region 19 is also disposed between body region 7 of main cell 111 and first separation body region 31 and between body region 7 of sense cell 112 and second separation body region 32. Each of the separation body regions 31 and 32 and barrier region 40 may be extended along the peripheral edge of sense region 21.

Although not illustrated, a gate layer is provided above first silicon carbide semiconductor layer 5. In FIG. 2B, only plurality of openings 13*p* formed in the gate layer are illustrated. Only gate layer where openings 13*p* are not formed functions as gate electrode 13. In FIG. 2B, contact surface 14*c* (in the following, source contact surface) contacting with source electrode 14 and first silicon carbide semiconductor layer 5 and contact surface 15*c* (in the following, sense contact surface) contacting with sense electrode 15 and first silicon carbide semiconductor layer 5 are represented by a dashed line. Source contact surface 14*c* and sense contact surface 15*c* are respectively disposed within openings 13*p* of the gate layer.

Next, a disposition relationship among main cell 111, sense cell 112, and barrier region 40 will be described.

Main cell 111 and sense cell 112 are two-dimensionally arranged on semiconductor substrate 1 in the x-direction and the y-direction. In the present specification, a direction crossing first separation body region 31, drift region 6, and second separation body region 32 is defined as a "first direction" or "x-direction" and a direction intersecting with the x-direction is defined as a "second direction" or "y-direction" in a plane parallel to the main surface semiconductor substrate 1. The normal direction to the main surface of semiconductor substrate 1, that is, the depth direction of first silicon carbide semiconductor layer 5 is defined as a "z-direction".

As illustrated in FIG. 2B, when viewed from the normal direction to semiconductor substrate 1, each main cell 111 and each sense cell 112 have a square shape and disposed in a staggered arrangement. More specifically, main cell 111 and sense cell 112 are disposed such that main cell 111 and sense cell 112 are subjected to ½ cycle shift in the y-direction. Otherwise, although not illustrated, main cell 111 and sense cell 112 may be arranged in a lattice arrangement.

When viewed from the normal direction to semiconductor substrate 1, semiconductor device 101 of the first exemplary embodiment includes a plurality of cell rows C extending in the x-direction. Respective cell rows C are arranged in the y-direction.

Figure 2C:
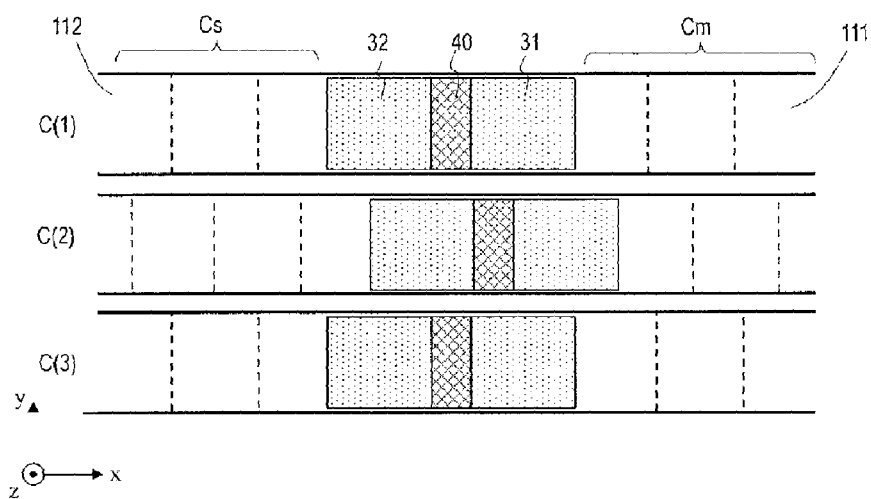
FIG. 2C is a schematic plan view for explaining cell row of the semiconductor device.

FIG. 2C is a schematic plan view for explaining a cell row C. In FIG. 2C, three cell rows C(1), C(2), and C(3) (in the following, collectively referred to as "cell row C") arranged in the y-direction are illustrated.

As can be seen from FIG. 2B and FIG. 2C, each cell row C include main cell row Cm having plurality of main cells 111 arranged in the x-direction, sense cell row Cs having plurality of sense cells 112 arranged in the x-direction, and first separation body region 31, barrier region 40, and second separation body region 32 that are positioned between the main cell row and sense cell row. In each cell row C, first separation body region 31 is connected to source electrode 14 in source contact surface 14c. In each cell row C, second separation body region 32 is connected to sense electrode 15 in sense contact surface 15c.

First separation body regions 31 of two adjacent cell rows C (for example, cell row C(1) and cell row C(2)) may be connected to each other. Similarly, second separation body regions 32 of two adjacent cell rows C may be connected to each other.

Barrier regions 40 of two adjacent cell rows C may be connected to each other. Barrier region 40 may be continuously formed in the y-direction. With this, it is possible to more efficiently suppress generation of the leakage current between main region 20 and sense region 21.

More specifically, as illustrated in FIG. 2B, barrier region 40 includes first portion 401 disposed within each cell row C and second portion 402 disposed between two adjacent cell rows C. First portion 401 may be extended in the y-direction and second portion 402 may be extended in the x-direction so as to connect barrier regions 40 of two adjacent cell rows C. With this, barrier region 40 is continuously formed in the y-direction in its entirety. Barrier region 40 may include at least first portion 401. For example, in a case where main cell 111 and sense cell 112 are disposed in a lattice arrangement, first portions 401 of two adjacent cell rows C in the y-direction may be directly connected to each other.

In an example indicated in the figure, although barrier region 40 is disposed in the middle of main region 20 and sense region 21, barrier region 40 may be disposed closer to sense region 21 than main region 20. With this, it is possible to make the depletion capacitance of PN junction formed between second separation body region 32 and drift region 6 small and thus enabling prevention of erroneous detection due to transient current during switching.

Since semiconductor device 101 has a configuration described above, semiconductor device 101 exhibits the following effect.

In the conventional semiconductor device disclosed in NPL 1, the parasitic bipolar transistor is formed by two separation body regions having a second conductivity type and a drift region having the first conductivity type and positioned between the separation body regions. In a case where the first conductivity type is n-type and the second conductivity type is p-type, the parasitic bipolar transistor is a parasitic PNP transistor. In the conventional semiconductor device, as will be described later, the leakage current between main and sense region can be generated due to punch-through of the parasitic bipolar transistor.

In contrast, the first conductivity type region positioned between two separation body regions 30 is highly-impurity-concentrated in semiconductor device 101. For that reason, a potential barrier is formed between separation body regions 31 and 32 and thus, punch-through of the parasitic bipolar transistor is suppressed. In separation region 23, highly-impurity-concentrated first conductivity type semiconductor layer 52 is disposed on first silicon carbide semiconductor layer 5 so as to make it possible to cut off the current path for holes near the main surface of first silicon carbide semiconductor layer 5. Accordingly, it becomes possible to reduce the leakage current than before.

Another Example of Semiconductor Device

Semiconductor device 101 includes highly-impurity-concentrated first conductivity type semiconductor layer 52 and barrier region 40 in separation region 23, but if any one of highly-impurity-concentrated first conductivity type semiconductor layer 52 and barrier region 40 is included, it becomes possible to reduce the leakage current. If both highly-impurity-concentrated first conductivity type semiconductor layer 52 and barrier region 40 are present, it is possible to the effect of leakage current suppression can be more substantial.

Figure 3:
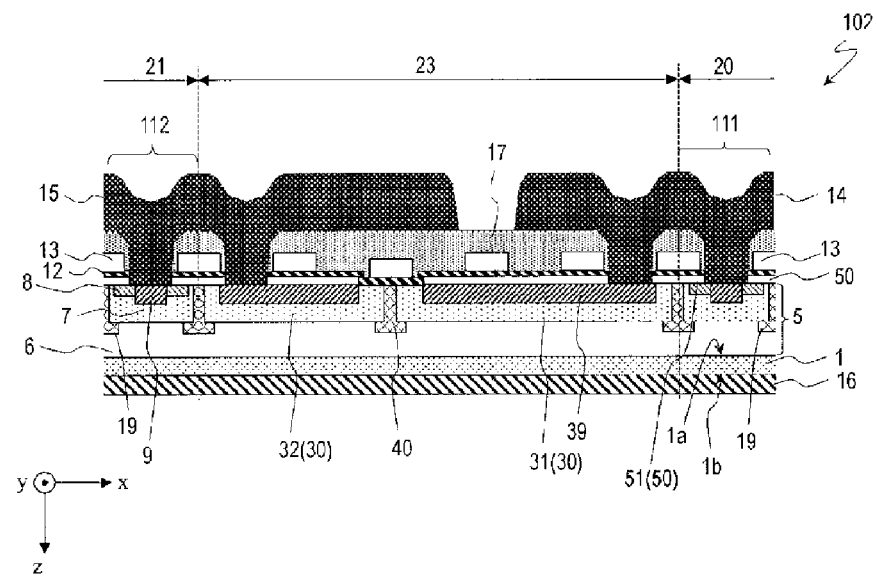
FIG. 3 is a cross-sectional view illustrating another semiconductor device of the present exemplary embodiment.

FIG. 3 is a cross-sectional view illustrating another semiconductor device 102 of the first exemplary embodiment. In FIG. 3 and subsequent figures, same reference numerals are given to the same constitutional elements as those of FIG. 2A and FIG. 2B.

Semiconductor device 102 is different from semiconductor device 101 illustrated in FIG. 2A and FIG. 2B in that highly-impurity-concentrated first conductivity type semiconductor layer 52 is not formed on barrier region 40. In this example, although second silicon carbide semiconductor layer 50 including channel layer 51 is extended into separation region 23, a portion of second silicon carbide semiconductor layer 50 on barrier region 40 and on end portions of separation body regions 30 on both sides of barrier region 40 are removed. Other structure is the same as that of semiconductor device 101 and thus, description thereof will be omitted.

Semiconductor device 102 may not include channel layer 51. In this case, in each main cell 111 and each sense cell 112, gate insulating film 12 is disposed to abut the main surface of first silicon carbide semiconductor layer 5. When a positive voltage is applied to gate electrode 13, electrons are induced at the interface of body region 7 and gate insulating film 12 between source region 8 and JFET region 19 and the portion between source region 8 and JFET region 19 becomes conductive with inversion layer formed (inversion channel structure).

Figure 4:
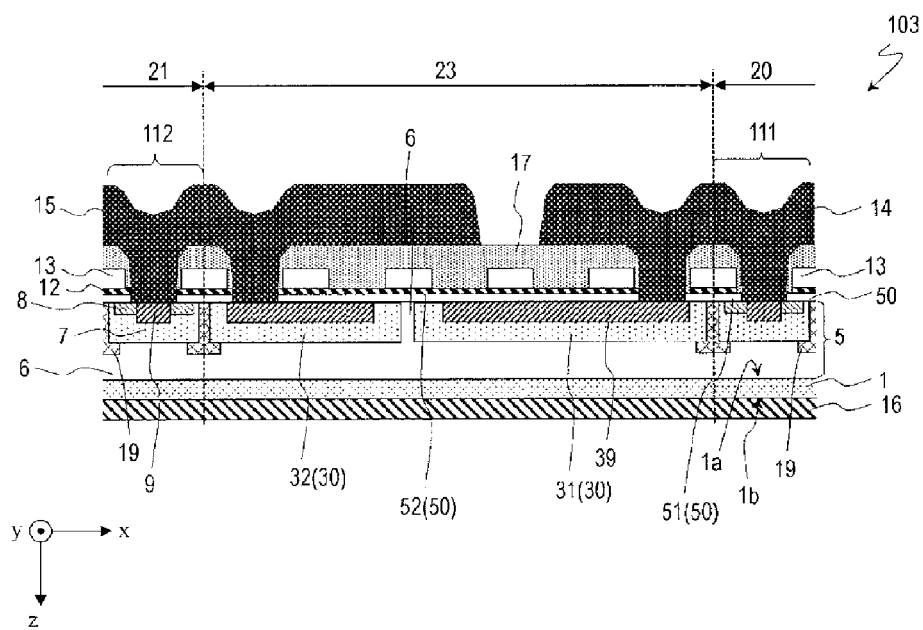
FIG. 4 is a cross-sectional view illustrating still another semiconductor device of the present exemplary embodiment.

FIG. 4 is a cross-sectional view illustrating still another semiconductor device 103 of the first exemplary embodiment.

Semiconductor device 103 is different from semiconductor device 101 illustrated in FIG. 2A and FIG. 2B in that barrier region 40 is formed between two adjacent separation body regions 30 in separation region 23. In semiconductor device 103, drift region 6 which is a lowconcentration first conductivity type region is positioned between separation body regions 30. Accordingly, the parasitic bipolar transistor is configured with separation body region 30 and drift region 6. Highly-impurity-concentrated first conductivity type semiconductor layer 52 is formed on two adjacent separation body regions 30 and on drift region 6 positioned between two adjacent separation body regions 30.

Manufacturing Method of Semiconductor Device 101

Next, an example of a manufacturing method of a semiconductor device according to the first exemplary embodiment will be described with reference to FIG. 5A to FIG. 5K. Here, an example of a manufacturing method of semiconductor device semiconductor device 101 will be described. In the following description, although the first conductivity type is defined as n-type and the second conductivity type is defined as p-type, the first conductivity type may be p-type and the second conductivity type may be n-type. A material and thickness of each layer, a type and concentration of impurities, and the like are also illustrative.

Figure 5A:
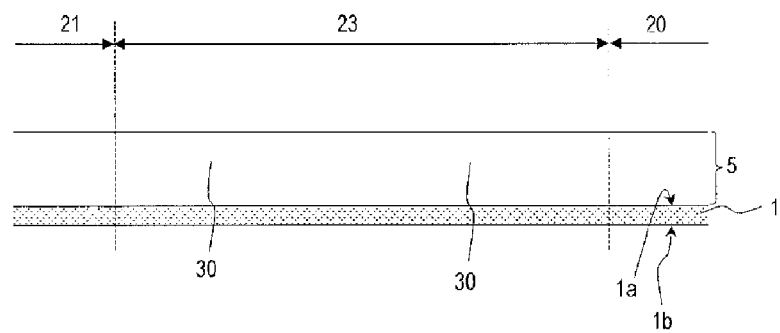
FIG. 5A is a cross-sectional view illustrating a process of an example of a manufacturing method of the semiconductor device.

First, as illustrated in FIG. 5A, n-type semiconductor substrate 1 is prepared. Next, n-type first silicon carbide semiconductor layer 5 is formed by, for example, epitaxial growth, on main surface 1a of semiconductor substrate 1. For semiconductor substrate 1, for example, a substrate in which a 4H-SiC(0001) surface is inclined by four degrees in a [11-20] direction is used. In semiconductor substrate 1, a concentration of n-type impurities is, for example, approximately $1\times10^{19}$ cm$^{-3}$. First silicon carbide semiconductor layer 5 is formed of, for example, 4H-SiC. In first silicon carbide semiconductor layer 5, an n-type impurity concentration is set to be lower than the n-type impurity concentration in semiconductor substrate 1. In first silicon carbide semiconductor layer 5, the concentration of n-type impurities, that is, the concentration of n-type impurities of the drift region is greater than or equal to $1\times10^{14}$ cm$^{-3}$ and less than or equal to $1\times10^{17}$ cm$^{-3}$, for example. The thickness of the first silicon carbide semiconductor layer 5 is, for example, approximately 10 μm.

Figure 5B:
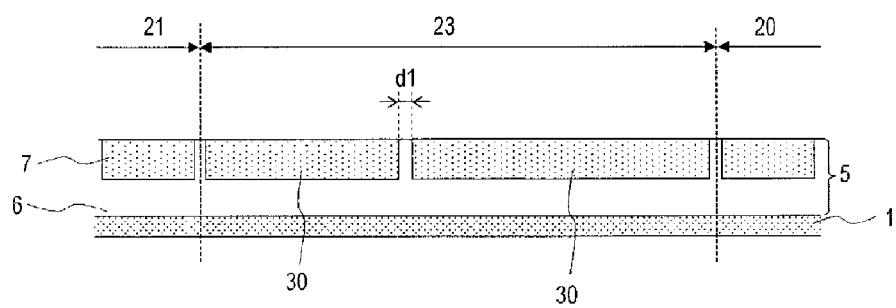
FIG. 5B is a cross-sectional view illustrating another process of the example of the manufacturing method of the semiconductor device.

Next, as illustrated in FIG. 5B, a mask (not illustrated) is formed on first silicon carbide semiconductor layer 5 and p-type impurity ions (for example, A1 ion or B ion) are implanted into first silicon carbide semiconductor layer 5. With this, body region 7 is formed in main region 20 and sense region 21 and also separation body region 30 is formed in separation region 23. The width of each body region 7 is, for example, 10 μm. The width of each separation body region 30 is set to be equal to the width of body region 7 or greater than the width body region 7, for example. A distance between adjacent body regions 7 and a distance d1 between adjacent separation body regions 30 is greater than or equal to 0.5 μm and less than or equal to 3.0 μm, for example.

In a case where body region 7 and separation body region 30 are simultaneously formed, the concentration profiles of p-type impurities of body region 7 and separation body region 30 in the depth direction are identical to each other. The doping concentration of p-type impurities is greater than or equal to $1\times10^{17}$ cm$^{-3}$ and less than or equal to $1\times10^{20}$ cm$^{-3}$, for example. The depths of body region 7 and separation body region 30 are, for example, approximately 0.8 μm, respectively. Body region 7 and separation body region 30 may be individually formed. In a case where these regions are individually formed, it is possible to respectively set a p-type doping concentration and a depth thereof. Although not illustrated, a field limited ring (FLR) may be formed in a termination region of semiconductor device 1, simultaneously with body region 7 and separation body region 30.

Figure 5C:
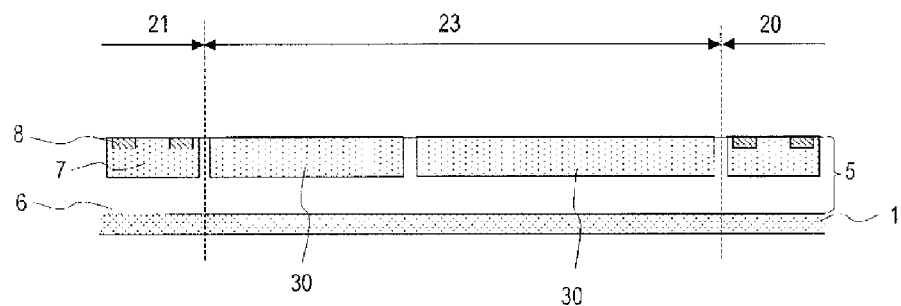
FIG. 5C is a cross-sectional view illustrating another process of the example of the manufacturing method of the semiconductor device.

Subsequently, as illustrated in FIG. 5C, n-type impurity ions (for example, nitrogen ion) are implanted into body region 7 using a mask (not illustrated) to form source region 8. The doping concentration of n-type impurities in source region 8 is greater than or equal to $1\times10^{18}$ cm$^{-3}$ and less than or equal to $1\times10^{21}$ cm$^{-3}$, for example.

Figure 5D:
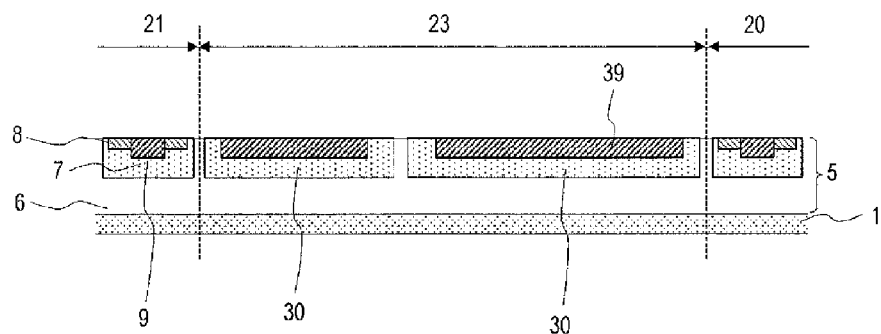
FIG. 5D is a cross-sectional view illustrating another process of the example of the manufacturing method of the semiconductor device.

As illustrated in FIG. 5D, p-type impurity ions (for example, Al ion) are implanted into body region 7 and separation body region 30 using a mask (not illustrated). With this, contact regions 9 and 39 are simultaneously formed. The doping concentration of p-type impurities in contact regions 9 and 39 is greater than or equal to $1\times10^{10}$ cm$^{-3}$ and less than or equal to $1\times10^{21}$ cm$^{-3}$, for example. The depth of contact regions 9 and 39 is, for example, approximately 400 nm. Contact region 39 is preferably not formed in the vicinity of a region in which barrier region 40 is formed among separation body region 30.

Figure 5E:
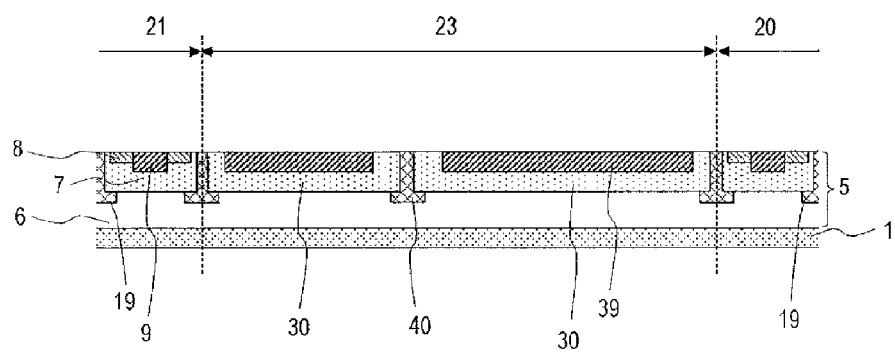
FIG. 5E is a cross-sectional view illustrating another process of the example of the manufacturing method of the semiconductor device.

Next, as illustrated in FIG. 5E, in main region 20 and sense region 21, n-type impurity ions (for example, A1 ion or B ion) are implanted, using a mask (not illustrated), into a region positioned between adjacent body regions 7 among first silicon carbide semiconductor layer 5 in main region 20 and sense region 21 and into the region positioned between adjacent separation body regions 30 among first silicon carbide semiconductor layer 5 in separation region 23. With this, JFET region 19 is formed in main region 20 and sense region 21 and also barrier region 40 is formed in separation region 23.

A region in which body region 7, source region 8, contact region 9, JFET region 19, separation body region 30, contact region 39, and barrier region 40 among first silicon carbide semiconductor layer 5 are not formed becomes drift region 6.

In a case where JFET region 19 and barrier region 40 are simultaneously formed, concentration profiles of n-type impurities in the depth directions of JFET region 19 and barrier region 40 are identical to each other. The doping concentration of n-type impurities is greater than or equal to $1\times10^{16}$ cm$^{-3}$ and less than or equal to $1\times10^{18}$ cm$^{-3}$, for example. The depth of JFET region 19 and barrier region 40 is set to be greater than that of, for example, body region 7 and separation body region 30. JFET region 19 and barrier region 40 may be individually formed. In a case where JFET region 19 and barrier region 40 are individually formed, the n-type impurity concentration and the depth can be respectively set.

The order of the impurity implantation processes illustrated in FIG. 5B to FIG. 5E is not particularly limited. After the impurity implantation processes, activation annealing is performed. For example, activation annealing is performed at a temperature of approximately 1700° C. in inert atmosphere for approximately 30 minutes.

Figure 5F:
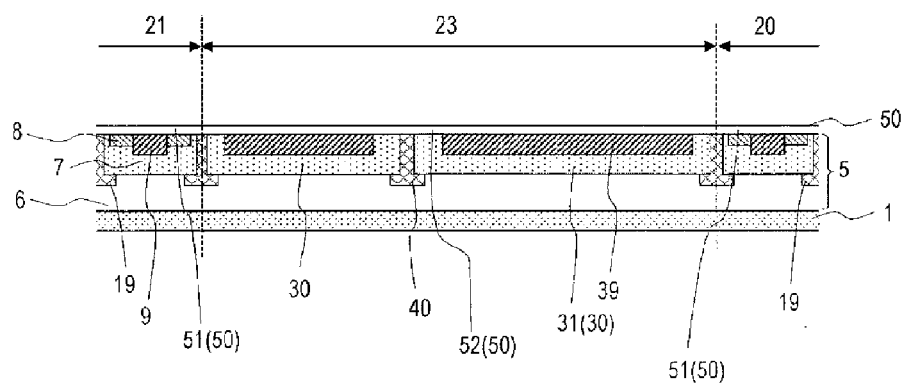
FIG. 5F is a cross-sectional view illustrating another process of the example of the manufacturing method of the semiconductor device.

Next, as illustrated in FIG. 5F, channel layer 51 and highly-impurity-concentrated first conductivity type semiconductor layer 52 are formed on first silicon carbide semiconductor layer 5. In highly-impurity-concentrated first conductivity type semiconductor layer 52, n-type impurities concentration is greater than or equal to $1\times10^{17}$ cm$^{-3}$ and less than or equal to $1\times10^{19}$ cm$^{-3}$, for example. The thickness of highly-impurity-concentrated first conductivity type semiconductor layer 52 is greater than or equal to 30 nm and less than or equal to 200 nm, for example.

In the first exemplary embodiment, second silicon carbide semiconductor layer 50 including channel layer 51 and the highly-impurity-concentrated first conductivity type semiconductor layer 52 is formed in the entire surface of first silicon carbide semiconductor layer 5. Second silicon carbide semiconductor layer 50 is formed by, for example, epitaxial growth. A method for forming second silicon carbide semiconductor layer 50 is not particularly limited. For example, second silicon carbide semiconductor layer 50 may be formed on a surface layer of first silicon carbide semiconductor layer 5 by ion implantation. Second silicon carbide semiconductor layer 50 may be formed of a single n-type type layer or may include a stacked structure.

Figure 5G:
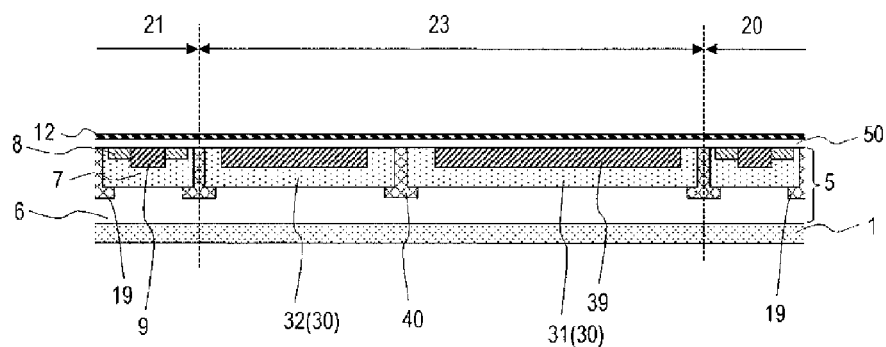
FIG. 5G is a cross-sectional view illustrating another process of the example of the manufacturing method of the semiconductor device.

Next, as illustrated in FIG. 5G, gate insulating film 12 is formed on the surface of second silicon carbide semiconductor layer 50. Gate insulating film 12 may be formed by, for example, thermal oxidation of second silicon carbide semiconductor layer 50. The thickness of gate insulating film 12 is, for example, approximately 70 nm.

Figure 5H:
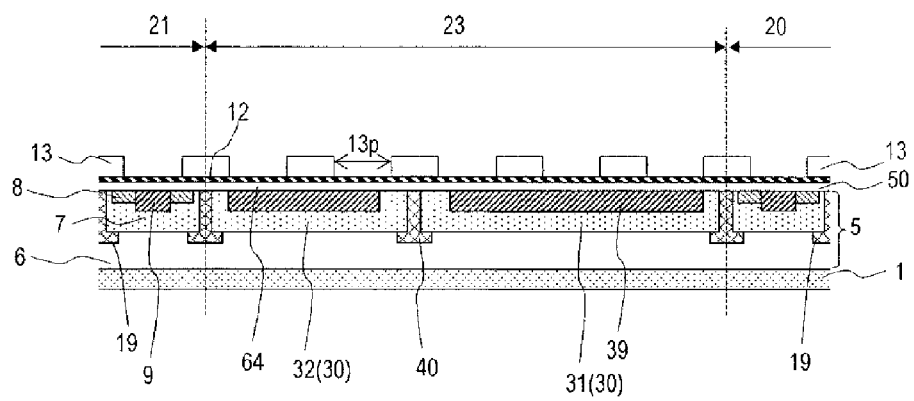
FIG. 5H is a cross-sectional view illustrating another process of the example of the manufacturing method of the semiconductor device.

Thereafter, as illustrated in FIG. 5H, a conductive film for gate is formed on the surface of gate insulating film 12 and patterning of the conductive film for gate is performed. With this, gate electrode 13 is obtained. As the conductive film for gate, for example, a polycrystalline silicon film (not illustrated) doped with approximately $7\times10^{20}$ cm$^{-3}$ of phosphor may be used. The thickness of the polycrystalline silicon film may be, for example, approximately 500 nm. Here, plurality of openings $13p$ are provided in the conductive film for gate to form a gate layer including gate electrode 13 of each main cell 111 and each sense cell 112. When viewed from the normal direction to semiconductor substrate 1, each opening $13p$ is disposed to overlap a portion of contact region 9 and source region 8 of each main cell 111 and sense cell 112. Also, in separation region 23, openings 13p having the same size may be disposed at the same pitch.

Figure 5I:
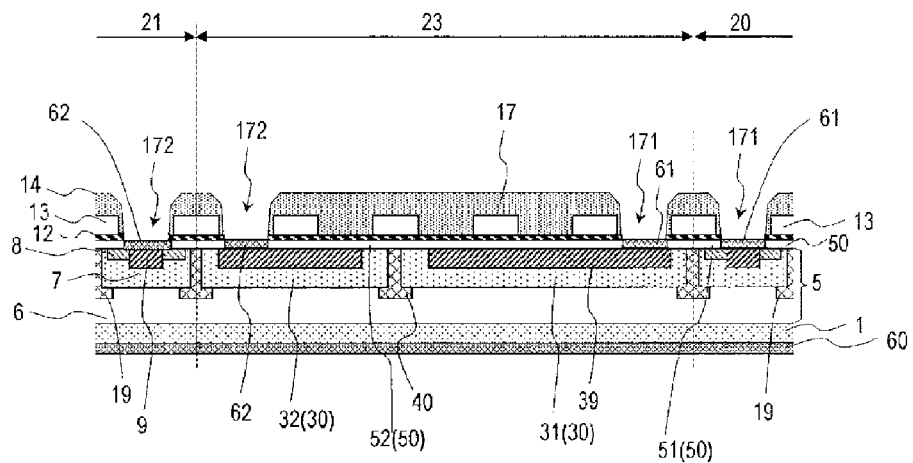
FIG. 5I is a cross-sectional view illustrating another process of the example of the manufacturing method of the semiconductor device.

Subsequently, as illustrated in FIG. 5I, interlayer dielectric film 17 formed of $SiO_2$ is deposited by a chemical vapor deposition (CVD) method so as to cover the surface of gate electrode 13 and the surface of gate insulating film 12. The thickness of interlayer dielectric film 17 is, for example, 1.5 µm. Thereafter, interlayer dielectric film 17 is patterned by dry etching using a mask (not illustrated). Here, a portion positioned on contact region 9 and on a portion of source region 8 of each main cell 111 and a portion partially positioned on contact region 39 within first separation body region 31, among interlayer dielectric film 17, are respectively removed to form opening 171 for the source electrode. Similarly, a portion positioned on contact region 9 and on a portion of source region 8 of each sense cell 112 and a portion partially positioned on contact region 39 within second separation body region 32, among interlayer dielectric film 17, are respectively removed to form opening 172 for the sense electrode.

Subsequently, source contact electrode 61 and sense contact electrode 62 are formed within opening 171 for the source electrode and within opening 172 for the sense electrode, respectively. Here, first, for example, a nickel film having a thickness of approximately 50 nm to 100 nm is formed on interlayer dielectric film 17. Next, the nickel layer is removed by etching except for inside of opening 171 for the source electrode and inside of opening 172 for the sense electrode, and a portion around thereof. After etching, heat treatment is performed at a temperature of, for example, 950° C. in inert atmosphere for five minutes so as to cause nickel to react with a silicon carbide. With this, source contact electrode 61 and sense contact electrode 62 formed of nickel silicide are formed. Source contact electrode 61 and sense contact electrode 62 are respectively brought into ohmic contact with a portion of source region 8 and contact region 9 of each main cell 111 and each sense cell 112.

Drain contact electrode 60 is formed on the back surface of semiconductor substrate 1. For example, titanium having a thickness of approximately 150 nm is deposited on the back surface of semiconductor substrate 1 and similar heat treatment is performed, and causes titanium to react with a silicon carbide surface. With this, drain contact electrode 60 formed of titanium silicide is formed. Drain contact electrode 60 is brought into ohmic contact with semiconductor substrate 1.

Figure 5J:
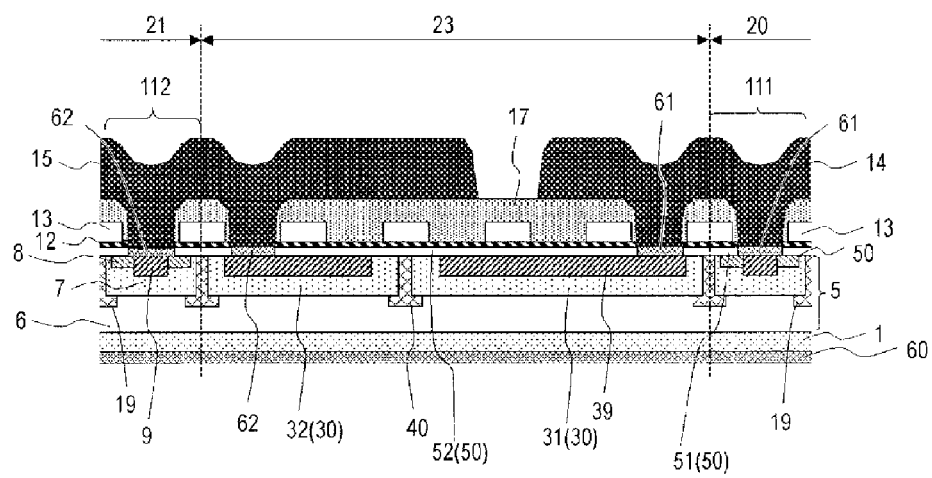
FIG. 5J is a cross-sectional view illustrating another process of the example of the manufacturing method of the semiconductor device.

Subsequently, as illustrated in FIG. 5J, aluminum having a thickness of approximately 4 µm is deposited on interlayer dielectric film 17 and within opening 171 for the source electrode and within opening 172 for the sense electrode as a top metal layer. Subsequently, source electrode 14 and sense electrode 15 are obtained by etching the top metal layer. Source electrode 14 abuts source contact electrode 61 within opening 171 for the source electrode. Sense electrode 15 abuts sense contact electrode 62 within opening 172 for the sense electrode.

Figure 5K:
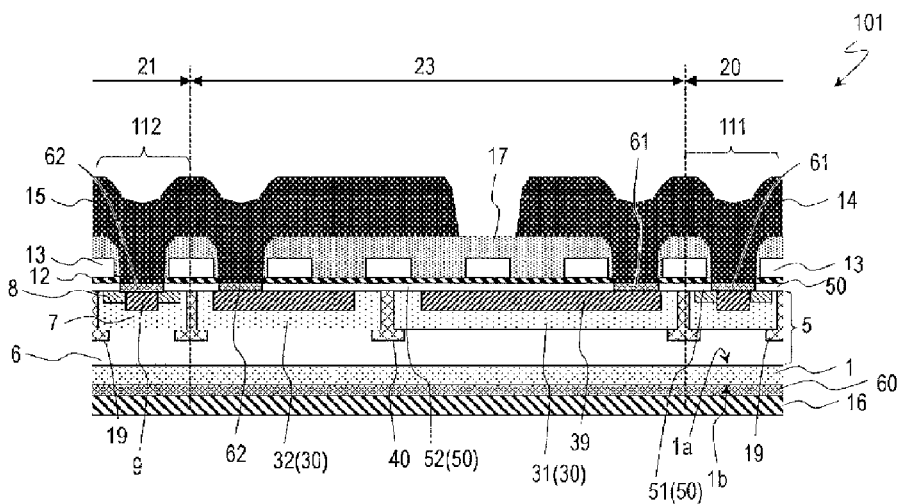
FIG. 5K is a cross-sectional view illustrating another process of the example of the manufacturing method of the semiconductor device.

Furthermore, as illustrated in FIG. 5K, for example, Ti, Ni, and Ag are stacked on drain contact electrode 60 in this order to form drain electrode 16. As described above, semiconductor device 101 is manufactured.

Although not illustrated, semiconductor devices 102 and 103 can be manufactured by the same method as the method described above. However, in a method for manufacturing semiconductor device 102, second silicon carbide semiconductor layer 50 is etched after second silicon carbide semiconductor layer 50 is formed. In a method for manufacturing semiconductor device 103, barrier region 40 is not formed in separation region 23 during the formation process of JFET region 19.

Investigation Results by Present Inventors

In the following, investigation results on leakage characteristics of a device with current sensing function will be described.

Investigation Results on Mechanisms for Generation of Leakage Current

First, investigation results on mechanisms for leakage current between main and sense region generated in the device with current sensing function will be described.

Figure 6A:
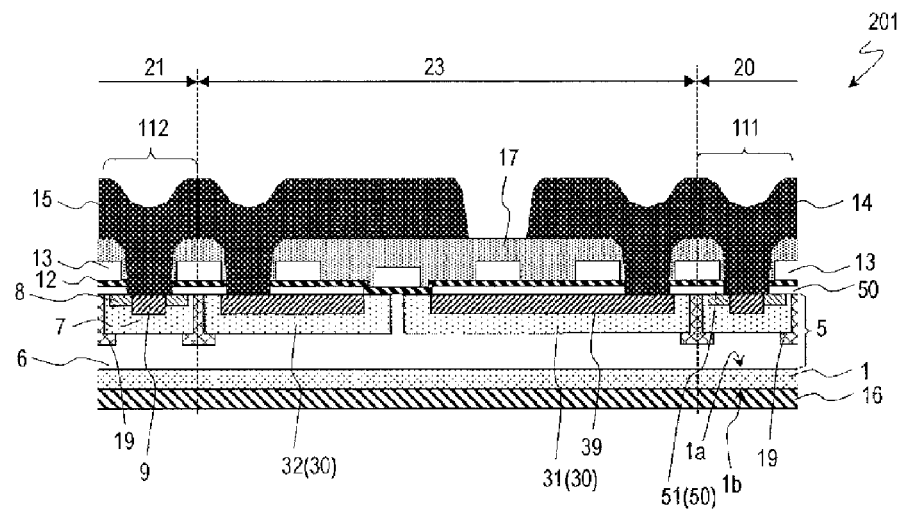
FIG. 6A is a schematic cross-sectional view illustrating a semiconductor device of a Reference example.

FIG. 6A is a schematic cross-sectional view illustrating semiconductor device 201 of Reference example. Semiconductor device 201 of Reference example is different from semiconductor device 101 in that barrier region 40 and highly-impurity-concentrated first conductivity type semiconductor layer 52 are not formed in separation region 23. A first conductivity type is set as n-type and a second conductivity type is set as p-type.

In semiconductor device 201, a region positioned between two p-type separation body regions 30 (here, between first separation body region 31 and second separation body region 32) in separation region 23 is drift region 6 which is a low-concentration n-type region. First separation body region 31 is electrically connected to source electrode 14 and second separation body region 32 is electrically connected to sense electrode 15. In the Reference example, first separation body region 31, second separation body region 32, and drift region 6 positioned between the separation body regions constitute a parasitic PNP transistor. A portion, which is positioned on the parasitic PNP transistor, of second silicon carbide semiconductor layer 50 is removed. For that reason, upper surfaces of first separation body region 31, second separation body region 32, and drift region 6 positioned between the separation body regions abut gate insulating film 12. Other device structure is the same as that of semiconductor device 101.

Figure 6B:
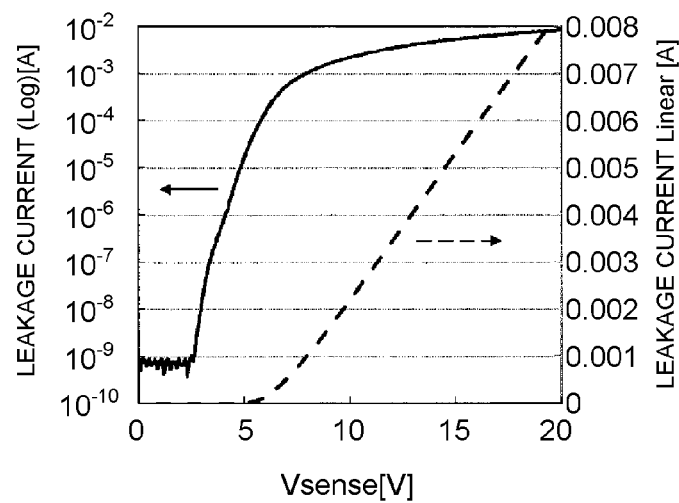
FIG. 6B is a graph illustrating a measurement result of leakage characteristics of the semiconductor device of the Reference example.

The present inventors manufactured a trial product of semiconductor device 201 of the Reference example and measured leakage characteristics thereof. Results are illustrated in FIG. 6B. In FIG. 6B, the horizontal axis represents potential difference Vsense between source electrode 14 and sense electrode 15 and the vertical axis represents a leakage current between source electrode 14 and sense electrode 15. From the results, it can be seen that when potential difference Vsense exceeds a predetermined value, the leakage current abruptly increases.

Figure 7A:
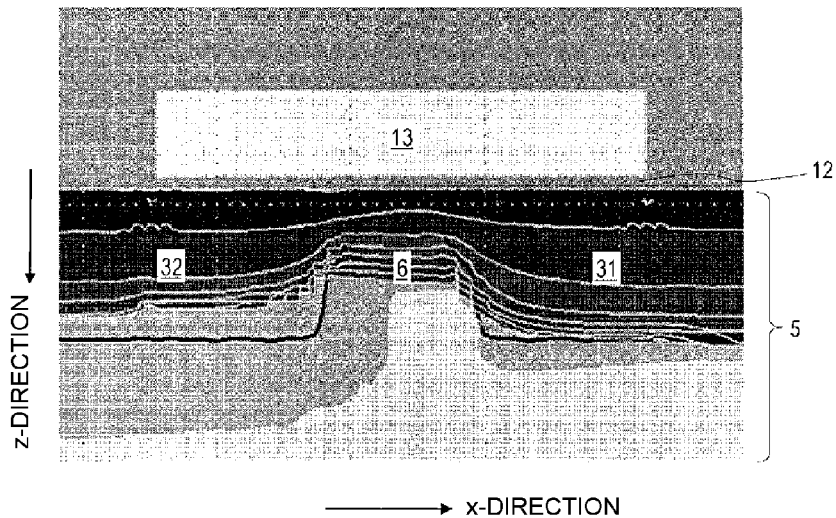
FIG. 7A is a view illustrating hole current density distribution in a cross-section of a separation region of the semiconductor device of the Reference example along the x-direction.
Figure 7B:
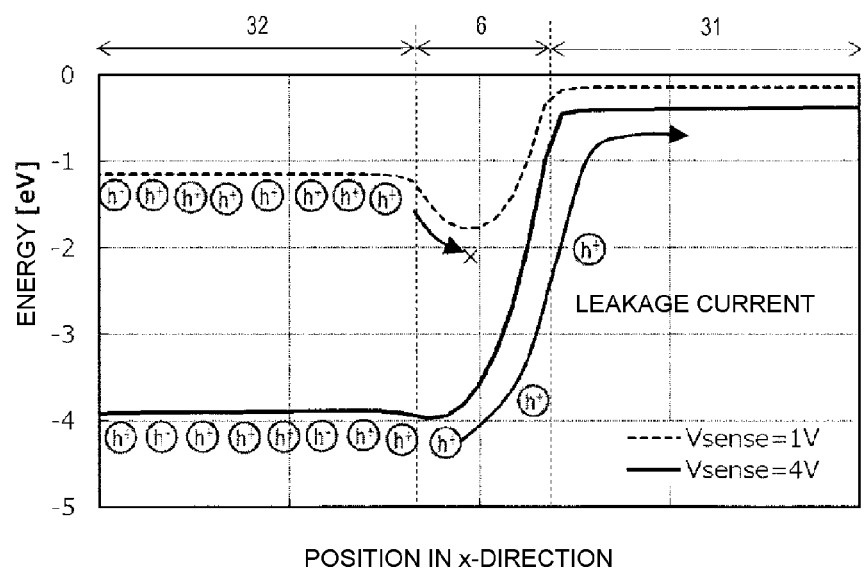
FIG. 7B is a graph illustrating energy of the valence band of a region in the vicinity of the surface of the silicon carbide semiconductor layer in the separation region of the semiconductor device of Reference example in the x-direction.

Next, hole current density distribution and energy of the valence band edge in semiconductor device 201 of Reference example were investigated using a device simulator. Computation results by the device simulator are illustrated in FIG. 7A and FIG. 7B. FIG. 7A illustrates the hole current density distribution in a cross-section of the parasitic PNP transistor, which is formed by first separation body region 31, drift region 6, and second separation body region 32, along the x-direction, when the potential difference Vsense is 4 V. FIG. 7B is a graph illustrating energy of the valence band edge of a region in the vicinity of the surfaces of first separation body region 31, drift region 6, and second separation body region 32 in the x-direction, when the potential difference Vsense is 1 V and 4 V. The "z-direction" in FIG. 7A is a depth direction of first silicon carbide semiconductor layer 5 (normal direction to the main surface of semiconductor substrate 1).

As can be seen from the computation results of FIG. 7A and FIG. 7B, when the potential difference Vsense is 1 V, the energy barrier exists between the first separation body region 31 and second separation body region 32 and holes within second separation body region 32 do not flow to first separation body region 31. However, when the potential difference Vsense becomes large (here, 4 V), energy of the second separation body region 32 becomes small and the energy barrier disappears. As a result, punch-through occurs and the leakage current flows from second separation body region 32 electrically connected to sense electrode 15, through drift region 6, to first separation body region 31 electrically connected to source electrode 14.

From the investigation results, it was found out that it is necessary to examine a device configuration capable of suppressing punch-through in order to reduce the leakage current between source electrode 14 and sense electrode 15. As a result of repetitive investigations on such a device configuration, the present inventors found out that either increasing the impurity concentration of the n-type region of the parasitic PNP transistor or disposing a highly-impurity-concentrated first conductivity type semiconductor layer on the n-type region can be effective in suppressing punch-through and thereby reducing the leakage current.

In the following, the leakage current reduction mechanism by such device configurations will be described in detail based on a simulation result and a measurement result. Leakage characteristics of Semiconductor Device of Examples and Comparative example In the examination of leakage characteristics, semiconductor devices having the same configurations as those of semiconductor devices 101, 102, and 103 illustrated in FIG. 2A, FIG. 3, and FIG. 4 were respectively used in Example 1 to Example 3. A semiconductor device having the same configuration as that of semiconductor device 201 illustrated in FIG. 6A was used in Comparative example 1. The semiconductor devices of Comparative example 1 and Examples 1 to 3 have the same configuration except for the presence and absence of barrier region 40 and highly-impurity-concentrated first conductivity type semiconductor layer 52. Configurations of these examples and comparative example are collectively summarized in Table 1.

TABLE 1

| | Barrier Region 40 | Highly-impurity-concentrated first conductivity type semiconductor layer 52 |
|---|---|---|
| Example 1 | Present | Present |
| Example 2 | Present | Absent |
| Example 3 | Absent | Present |
| Comparative example 1 | Absent | Absent |

Examination Result by simulation
Leakage Current Reducing Effect by Highly-Impurity-Concentrated First Conductivity Type Semiconductor Layer 52

First, leakage characteristics of the semiconductor devices of Comparative example 1 and Example 3 was investigated using a device simulator in order to investigate the effect of the highly-impurity-concentrated first conductivity type semiconductor layer 52.

Figure 8A:
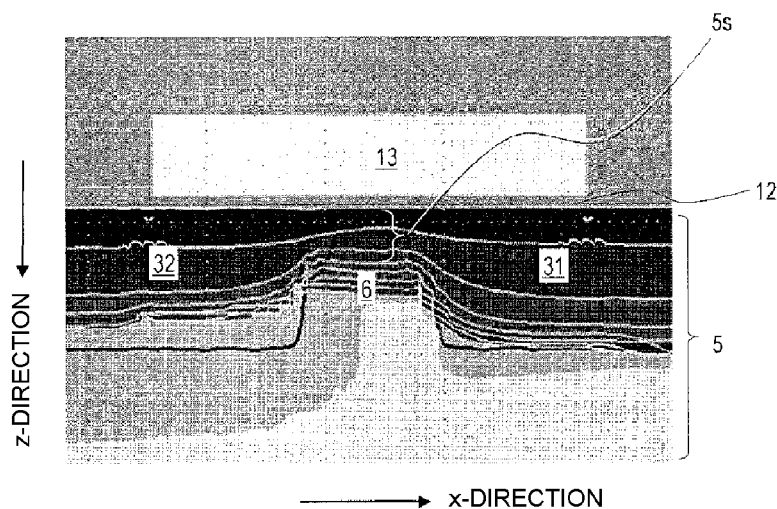
FIG. 8A is a view illustrating the hole current density distribution in a cross-section of a separation region of a semiconductor device of Comparative example 1 along the x-direction.
Figure 8B:
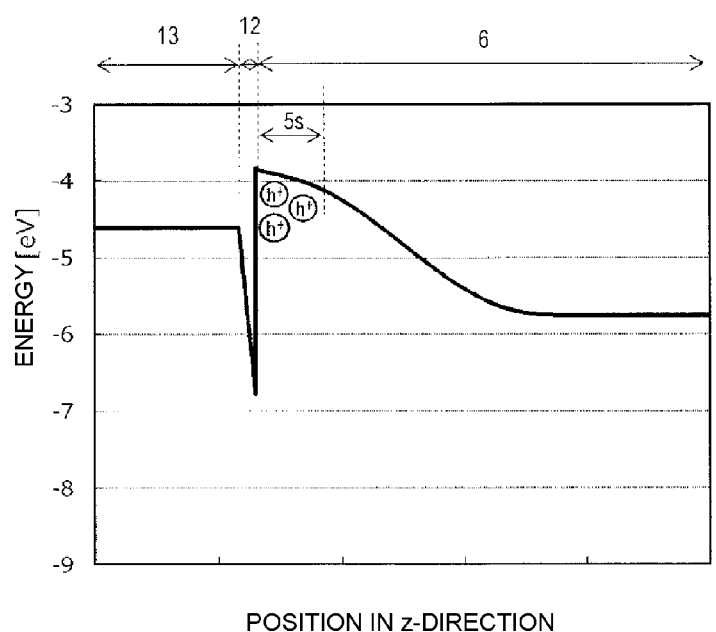
FIG. 8B is a graph illustrating energy of the valence band of the silicon carbide semiconductor layer in the depth direction, in the semiconductor device of Comparative example 1.
Figure 9A:
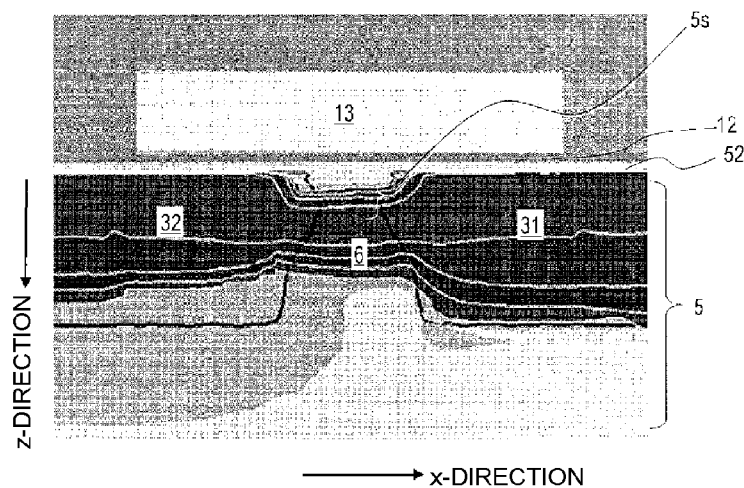
FIG. 9A is a view illustrating the hole current density distribution in a cross-section of a separation region of a semiconductor device of Example 3 along the x-direction.
Figure 9B:
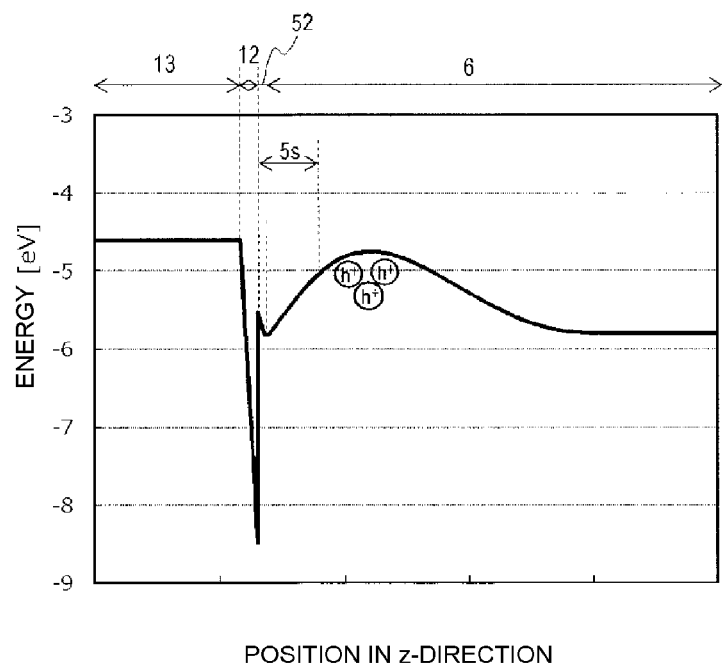
FIG. 9B is a graph illustrating energy of the valence band edge of the silicon carbide semiconductor layer in the depth direction, in the semiconductor device of Example 3.

FIG. 8A and FIG. 8B correspond to the computation result for the semiconductor device of Comparative example 1. FIG. 8A illustrates the hole current density distribution in a cross-section of separation region 23 of the semiconductor device of Comparative example 1 along the x-direction when the potential difference Vsense is 4 V. FIG. 8B illustrates energy of the valence band edge of a portion positioned below the center of gate electrode 13 among first silicon carbide semiconductor layer 5 in the depth direction (z-direction), in the semiconductor device of Comparative example 1. Similarly, FIG. 9A and FIG. 9B correspond to the computation result for the semiconductor device of Example 3. FIG. 9A illustrates the hole current density distribution in a cross-section of separation region 23 of the semiconductor device of Example 3 along the x-direction, when the potential difference Vsense is 4 V. FIG. 9B illustrates energy of the valence band edge of a portion positioned below the center of gate electrode 13 among first silicon carbide semiconductor layer 5 in the z-direction, in the semiconductor device of Example 3.

In the present specification, region 5s in the vicinity of the interface of drift region 6 and gate insulating film 12 positioned between two separation body regions 31 and 32 in separation region 23 is referred to as an "n-type surface region". In Comparative example 1, as illustrated in FIG. 8B, holes are accumulated in n-type surface region 5s. For that reason, as illustrated in FIG. 8A, current path for holes is generated in the vicinity of the surface of first silicon carbide semiconductor layer 5, thus electrically connecting separation body region 32, drift region 6, and separation body region 31 in Comparative example 1.

On the other hand, in Example 3, as illustrated in FIG. 9B, high-concentration n-type semiconductor layer 52 is provided on drift region 6 so as to cause holes to disappear from n-type surface region 5s of drift region 6. This is because n-type impurities in high-concentration n-type semiconductor layer 52 are positively charged when ionized and repulse holes (positive charges) that accumulate at the surface of first silicon carbide semiconductor layer 5. For that reason, it is thought that as illustrated in FIG. 9A, regions having high hole accumulation density in the surfaces of separation body regions 31 and 32 are no longer electrically connected through drift region 6 and the hole current path disappears in the vicinity of the surface of first silicon carbide semiconductor layer 5.

Figure 10:
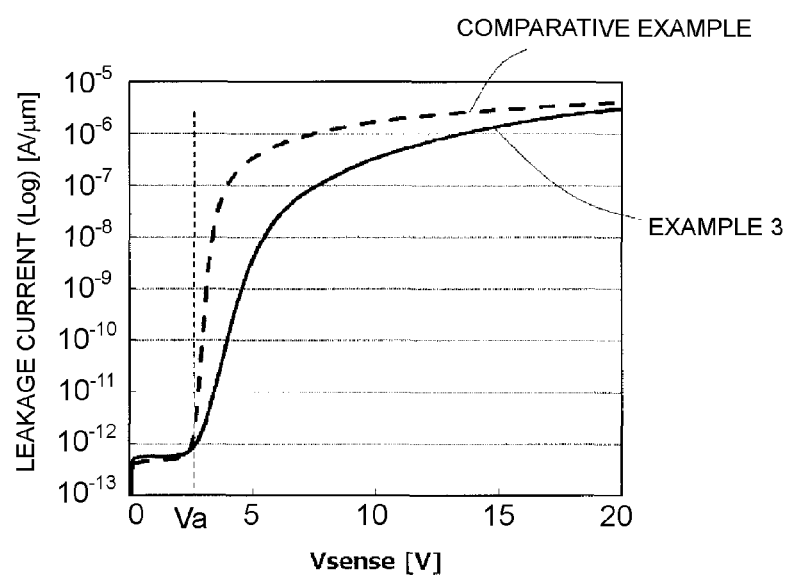
FIG. 10 is a graph illustrating computation results of leakage characteristics of the semiconductor device of Comparative example and Example 3.

FIG. 10 illustrates the computation result illustrating a relationship between the potential difference Vsense and the leakage current in the semiconductor devices of Comparative example 1 and Example 3. In the semiconductor devices of Comparative example 1 and Example 3, the turn-on voltages Va for the leakage current are substantially the same. However, in Example 3, an abrupt increase of a leakage current value is suppressed and the leakage current value is further reduced than in Comparative example 1. It is thought that such reduction of the leakage current value is due to disappearance of the hole current path as described above.

Leakage Current Reducing Effect due to Barrier Region 40

Next, in order to investigate the effect due to barrier region 40, leakage characteristics of the semiconductor devices of Comparative example 1 and Example 2 were investigated using the device simulator.

Figure 11A:
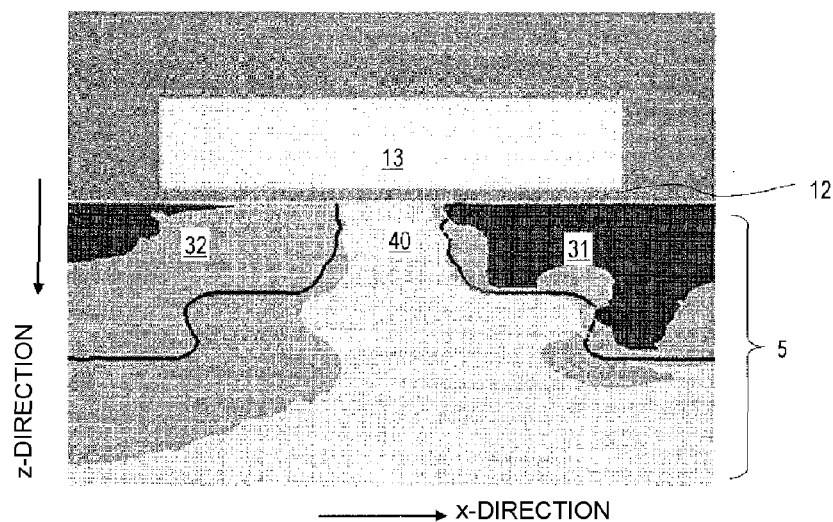
FIG. 11A is a view illustrating the hole current density distribution in a cross-section of a separation region of a semiconductor device of Example 2 along the x-direction.
Figure 11B:
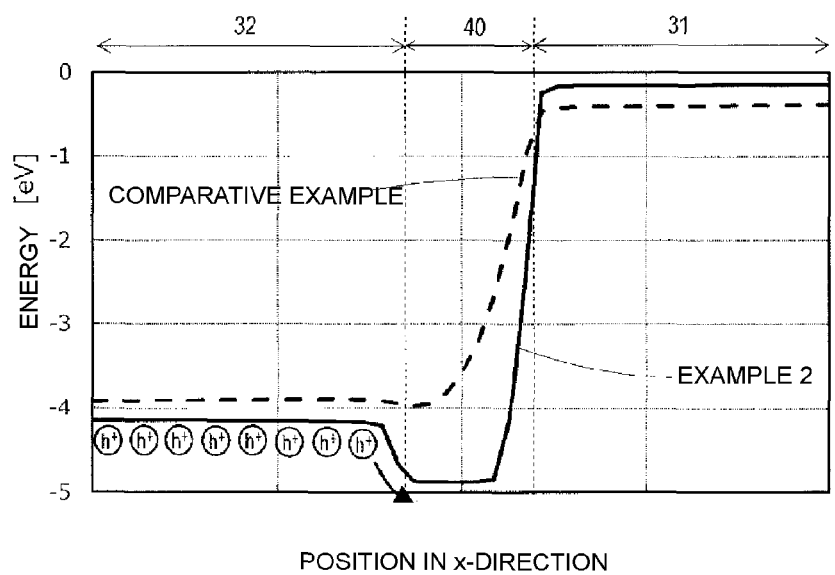
FIG. 11B is a graph illustrating energy of the valence band of the surface of the silicon carbide semiconductor layer in the x-direction, in the semiconductor device of Example 2 and Comparative example 1.

FIG. 11A illustrates the hole current density distribution in a cross-section of first separation body region 31, barrier region 40, and second separation body region 32 of a semiconductor device of Example 2 along the x-direction. FIG. 11B illustrates energy of the valence band edge of a portion positioned in the vicinity of the surfaces of first separation body region 31, barrier region 40, and second separation body region 32 in the x-direction, in the semiconductor device of Example 2. Both FIG. 11A and FIG. 11B illustrate the computation result when the potential difference Vsense is 4 V. For purpose of comparison, energy of the valence band edge in the semiconductor device of Comparative example 1 is also illustrated in FIG. 11B.

As illustrated in FIG. 11A, in Example 2, even when the potential difference Vsense is increased, a depletion layer is not connected between the first separation body region 31 and the second separation body region 32, that is, punch-through does not occur. This is because even when the potential difference Vsense is high as illustrated in FIG. 11B, the energy barrier can be maintained at the boundary portion between the first separation body region 31 and second separation body region 32.

Figure 12:
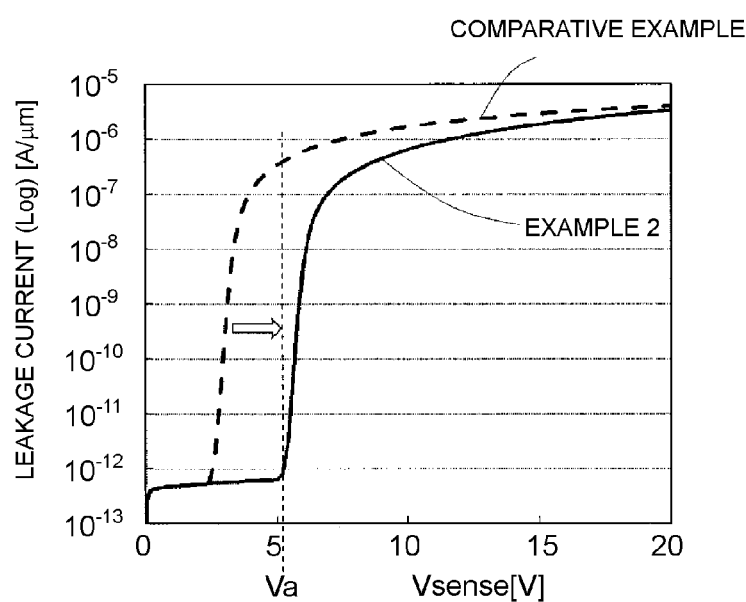
FIG. 12 is a graph illustrating computation results of the leakage characteristics of the semiconductor device of the Comparative example and Example 2.

FIG. 12 illustrates the computation result illustrating a relationship between potential difference Vsense and the leakage current in the semiconductor devices of Comparative example 1 and Example 2. As can be seen from the computation result, in Example 2, the turn-on voltage Va for the leakage current is shifted to a higher voltage than in Comparative example 1. That is, punch-through hardly occurs in the parasitic PNP transistor in Example 2 in comparison with Comparative example 1. Accordingly, it can be seen that punch-through is suppressed by barrier region 40 and as a result, the leakage current is reduced.

Leakage Current Reducing Effect due to Highly-Impurity-Concentrated First Conductivity Type Semiconductor Layer 52 and Barrier Region 40

In order to investigate effect by providing both highly-impurity-concentrated first conductivity type semiconductor layer 52 and barrier region 40, leakage characteristics of the semiconductor devices of Comparative example 1 and Examples 1 to 3 were obtained and compared, using the device simulator.

Figure 13A:
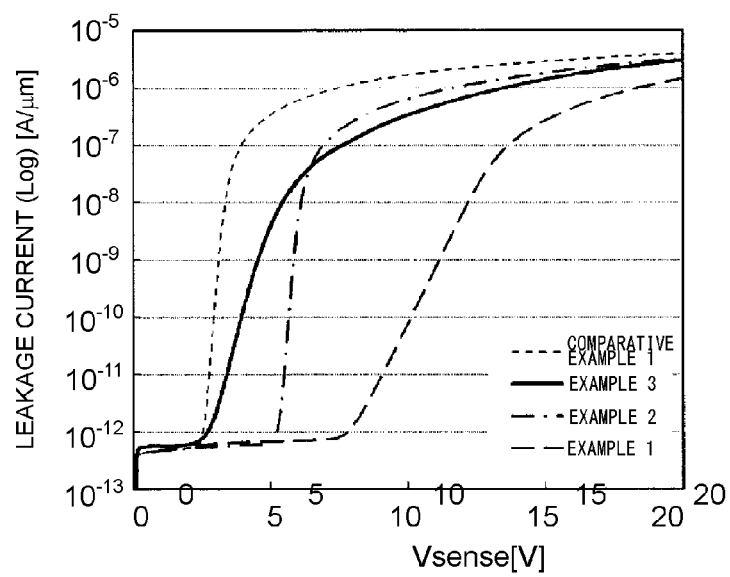
FIG. 13A is a graph illustrating computation results which represent a relationship between potential difference Vsense between a source electrode and a sense electrode and a leakage current (log scale), in the semiconductor device in the Comparative example and Examples 1 to 3.
Figure 13B:
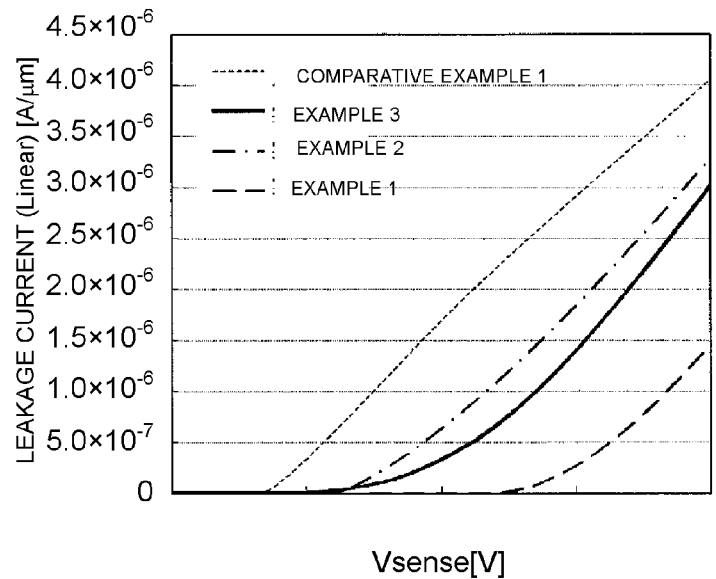
FIG. 13B is a graph illustrating computation results which represent a relationship between the potential difference between the source electrode and the sense electrode and the leakage current (linear scale), in the semiconductor device in Comparative example and Examples 1 to 3.

FIG. 13A and FIG. 13B illustrate the computation results illustrating a relationship between potential difference Vsense and the leakage current of Comparative example 1 and Examples 1 to 3. Although FIG. 13A and FIG. 13B illustrate the same measurement result, the leakage current is represented in log scale in FIG. 13A and in linear scale in FIG. 13B.

From this result, in the semiconductor device of Example 1, it can be seen that simultaneously disposing highly-impurity-concentrated first conductivity type semiconductor layer 52 on barrier region 40 and increasing the n-type concentration of barrier region 40 are effective in shifting the turn-on voltage of the leakage current to a higher voltage and in suppressing the abrupt increase of the leakage current. Accordingly, it is concluded that the semiconductor device of Example 1 is very effective in reducing the leakage current.

Measurement Results

Figure 14A:
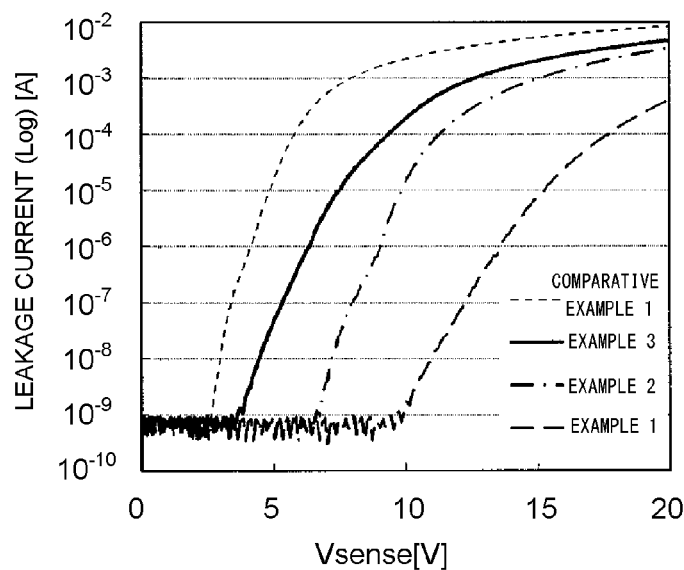
FIG. 14A is a graph illustrating measurement results which represent a relationship between the potential difference between the source electrode and the sense electrode and the leakage current (log scale), in the semiconductor device in Comparative example and Examples 1 to 3.
Figure 14B:
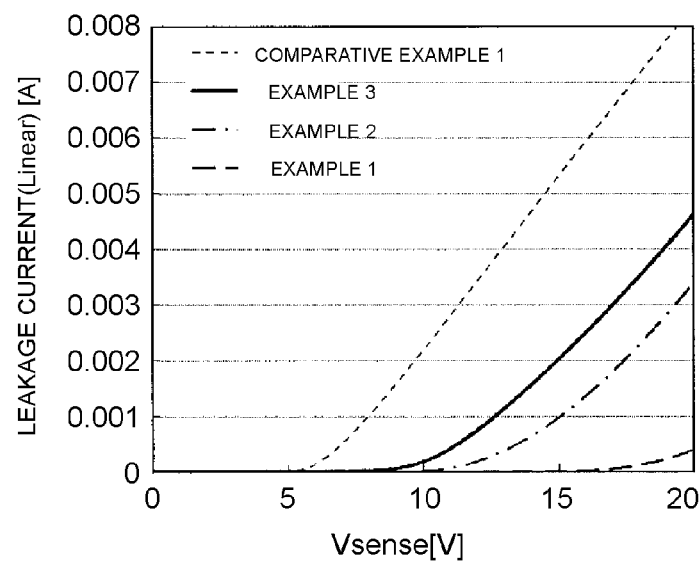
FIG. 14B is a graph illustrating measurement results which represent a relationship between the potential difference between the source electrode and the sense electrode and the leakage current (linear scale), in the semiconductor device in Comparative example and Examples 1 to 3.

Subsequently, the present inventors manufactured the trial products of the semiconductor devices of the Comparative example 1 and Examples 1 to 3 and measured the relationship between potential difference Vsense and the leakage characteristics thereof. The results are illustrated in FIG. 14A and FIG. 14B. Although FIG. 14A and FIG. 14B illustrate the same measurement result, the leakage current is represented in log scale in FIG. 14A and in linear scale in FIG. 14B.

The measurement results substantially coincide with the simulation results illustrated in FIG. 13A and FIG. 13B. Accordingly, it is confirmed that the simulation results are proper and the leakage current can be significantly suppressed by the configurations of Example 1 to 3.

In the investigation results described above, an example in which the first conductivity type is n-type and the second conductivity type is p-type is described, but is not limited thereto. The first conductivity type may be p-type and the second conductivity type may be n-type.

Second Exemplary Embodiment

In the following, a semiconductor device of a second exemplary embodiment will be described with reference to FIG. 15A to FIG. 15C.

Figure 15A:
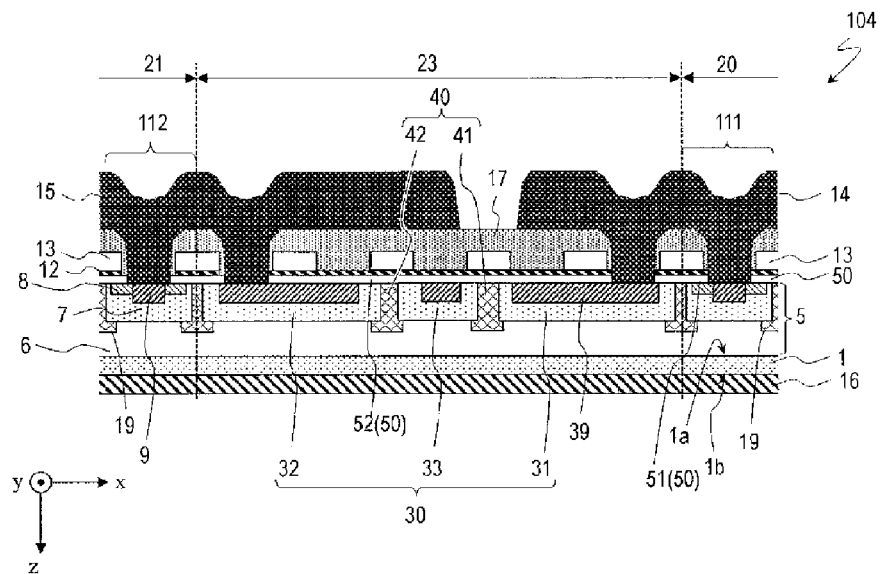
FIG. 15A is a cross-sectional view of a portion of a semiconductor device according to a second exemplary embodiment.

FIG. 15A is a cross-sectional view of a portion of semiconductor device 104 according to a second exemplary embodiment and corresponds to a cross-section taken along line A-A' of FIG. 1C. FIG. 15B is an enlarged plan view illustrating a portion of the semiconductor device 104 and illustrates a surface of first silicon carbide semiconductor layer 5 in main region 20, separation region 23, and sense region 21. In FIG. 15B, contact surface 14c contacting with source electrode 14 and first silicon carbide semiconductor layer 5, contact surface 15c contacting with sense electrode 15 and first silicon carbide semiconductor layer 5, and plurality of openings 13p provided on the gate layer are represented by a broken line. FIG. 15C is a schematic plan view for explaining cell row C of semiconductor device 104.

In the following, description will be made mainly on matters different from semiconductor device 101 of the first exemplary embodiment and description of the same configuration as that of semiconductor device 101 will be omitted.

In semiconductor device 104, another third separation body region 33 is disposed between first separation body region 31 and second separation body region 32, in separation region 23. Barrier region 40 is formed between first separation body region 31 and third separation body region 33 and between second separation body region 32 and third separation body region 33. Barrier region 40 positioned in the first separation body region 31 side is referred to as "first barrier region 41" and barrier region 40 positioned in the second separation body region 32 side is referred to as "second barrier region 42". In this example, in each cell row C, although two barrier regions 40 are disposed between first separation body region 31 and second separation body region 32, three or more barrier regions 40 may be disposed between the separation body regions.

Figure 15B:
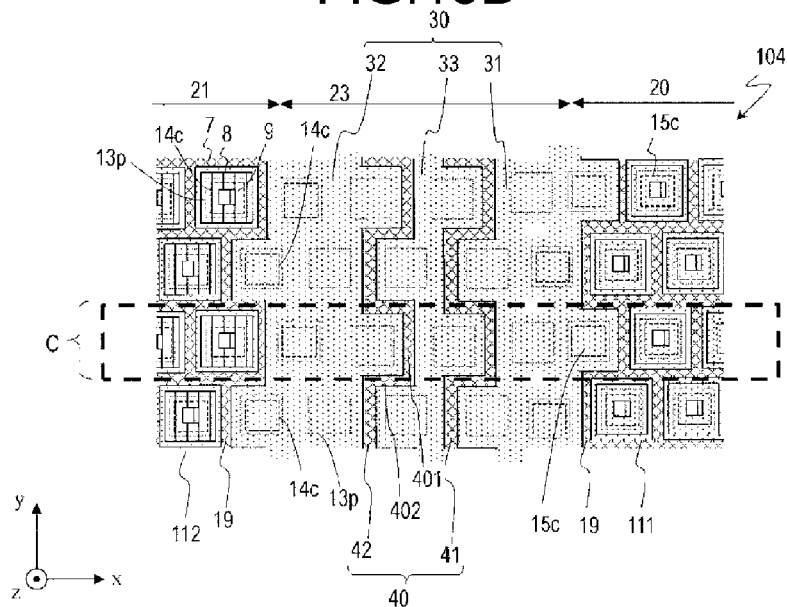
FIG. 15B is an enlarged plan view illustrating a portion of the semiconductor device and is a view illustrating a surface of the first silicon carbide semiconductor layer in the main region, the separation region, and the sense region.
Figure 15C:
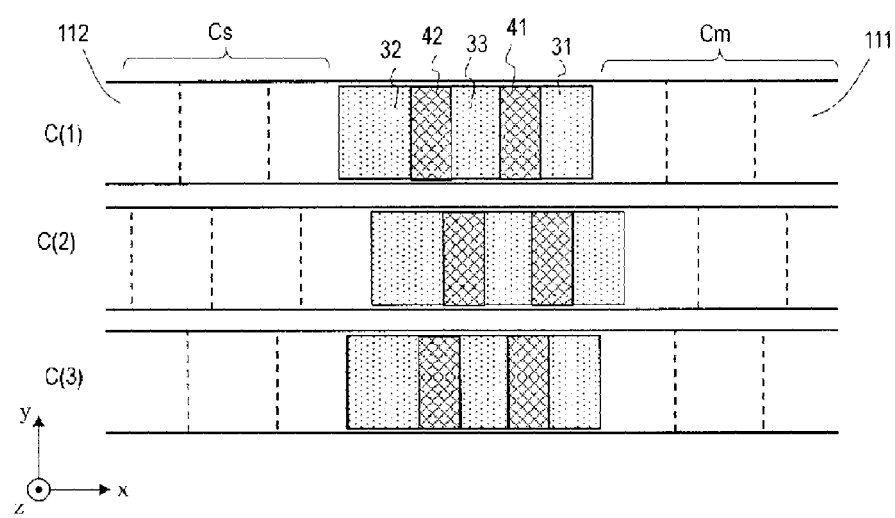
FIG. 15C is a schematic plan view for explaining cell row of the semiconductor device.

As illustrated in FIG. 15B and FIG. 15C, semiconductor device 104 includes plurality of cell rows C. Plurality of cell rows C are arranged in the y-direction. Each cell row C includes main cell row Cm having plurality of main cells 111 arranged in the x-direction and sense cell row Cs having plurality of sense cells 112 arranged in the x-direction. Each cell row C includes first separation body region 31, first barrier region 41, third separation body region 33, second barrier region 42, and second separation body region 32 between main cell row Cm and sense cell row Cs in this order, from the main cell side.

First separation body regions 31 of two adjacent cell rows C may be connected to each other. Similarly, second separation body regions 32 and third separation body regions 33 of two adjacent cell rows C may also be respectively connected to each other. Furthermore, first barrier regions 41 of two adjacent cell rows C may be connected to each other. Similarly, second barrier regions 42 of two cell rows C adjacent to each other in the y-direction may be connected to each other. For example, first separation body region 31, second separation body region 32, third separation body region 33, first barrier region 41, and second barrier region 42 may be continuously formed in the same direction (y-direction) as an arrangement direction of cell row C. With this, it is possible to more efficiently suppress generation of the leakage current between main region 20 and sense region 21.

More specifically, as illustrated in FIG. 15B, each of first barrier region 41 and second barrier region 42 may include first portion 401 disposed within cell row C and second portion 402 disposed between two adjacent cell rows C. First portion 401 may be extended in the y-direction and second portion 402 may be extended in the x-direction so as to connect barrier regions 40 of two adjacent cell rows C.

The disposition of separation body region 30 and barrier region 40 is not limited to an example illustrated in FIG. 15B. For example, plurality of barrier regions 40 are connected to each other or spacing between barrier regions 40 is made large to make it possible to more reliably and electrically isolate main region 20 and sense region 21 from each other.

Figure 16:
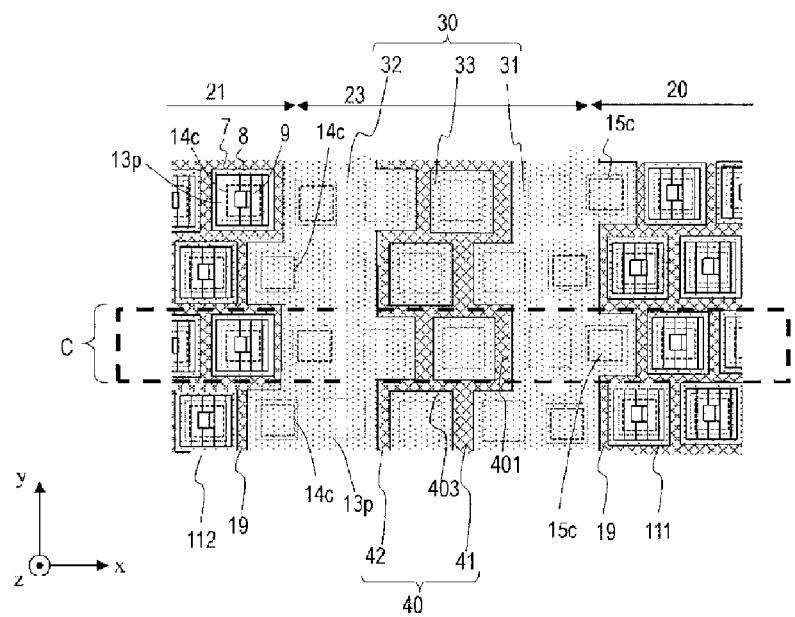
FIG. 16 is an enlarged plan view illustrating a portion of a semiconductor device of Modified example 1.
Figure 17:
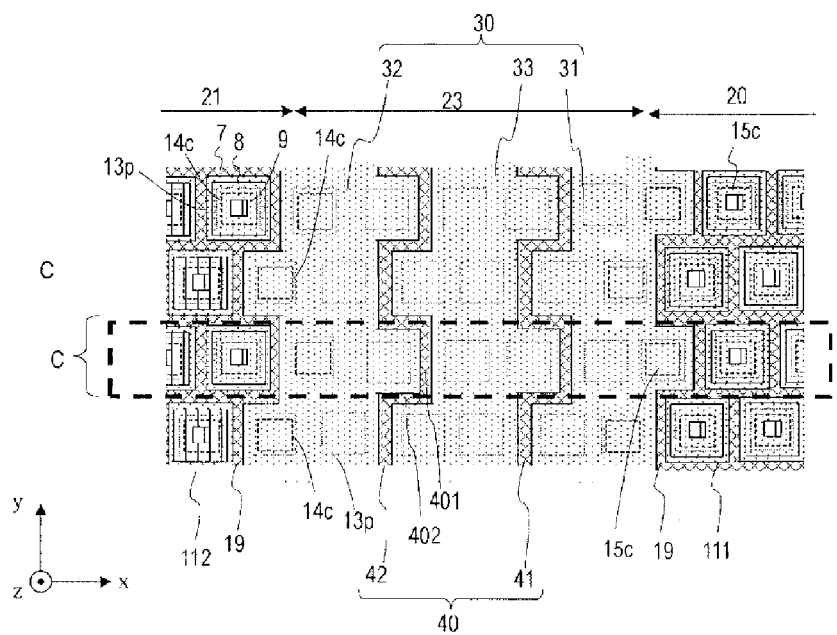
FIG. 17 is an enlarged plan view illustrating a portion of a semiconductor device of Modified Example 2.
Figure 18:
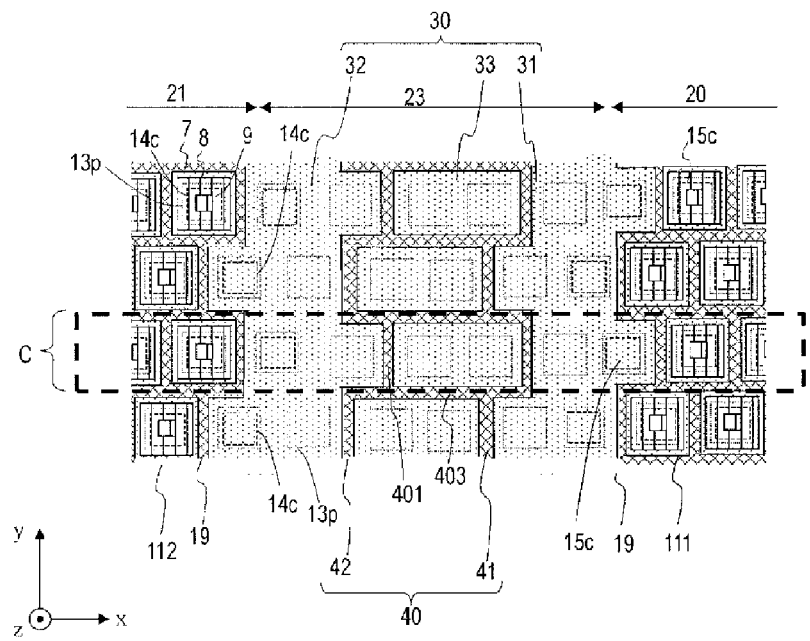
FIG. 18 is an enlarged plan view illustrating a portion of a semiconductor device of Modified Example 3.
Figure 19:
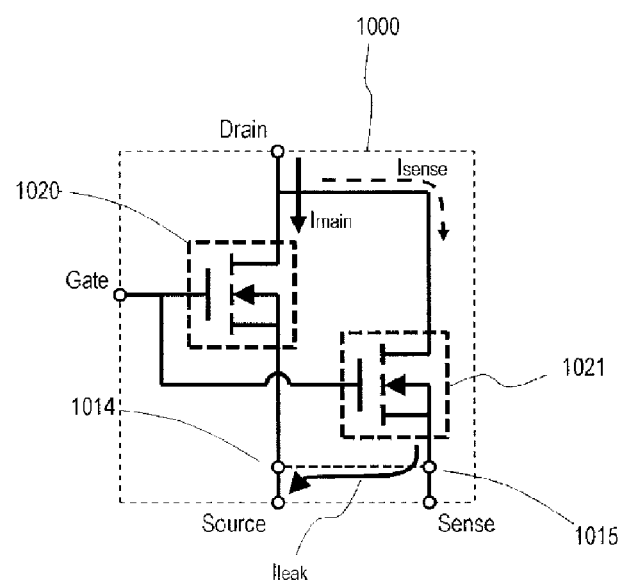
FIG. 19 is a schematic diagram for explaining an equivalent circuit of a device with current sensing.

FIG. 16 to FIG. 18 are enlarged plan views that respectively illustrate the semiconductor device of Modified example 1 to Modified Example 3. In the following, description will be made on matters different from the configuration of semiconductor device 104 illustrated in FIG. 15B.

In the semiconductor device of Modified example 1 illustrated in FIG. 16, first barrier region 41 and the second barrier region 42 are connected to each other. Plurality of third separation body regions 33 are discretely arranged between first separation body region 31 and second separation body region 32 in the y-direction. Two adjacent third separation body regions 33 are separated by barrier region 40. Each third separation body region 33 may be surrounded by barrier region 40.

More specifically, in Modified example 1, when viewed from the normal direction to semiconductor substrate 1, third portion 403 connecting first portion 401 of first barrier region 41 with first portion 401 of second barrier region 42 is further disposed in each cell row C. Third portion 403 is disposed between corresponding cell row C and cell row C adjacent thereto.

In the semiconductor device of Modified Example 2 illustrated in FIG. 17, a distance between first barrier region 41 and second barrier region 42 is large in comparison with semiconductor device 104 in each cell row C and according to this, a width of third separation body region 33 in the x-direction is large. Other structures are the same as that of semiconductor device 104.

In the semiconductor device of Modified Example 3 illustrated in FIG. 18, a distance between first barrier region 41 and second barrier region 42 is large in comparison with the semiconductor device of Modified example 1 in each cell row C and according to this, a width of third separation body region 33 in the x-direction is large. Other structures are the same as that of the semiconductor device of Modified example 1.

In Modified Example 2 and Modified Example 3, although third separation body region 33 extends over two dummy cells in the x-direction, the width of third separation body region 33 in the x-direction may be made larger.

The semiconductor device of the present disclosure is not limited to the exemplary embodiments described above. The semiconductor device of the present disclosure may be a silicon semiconductor device using semiconductor, for example, silicon semiconductor other than silicon carbide semiconductor.

The technology disclosed in the present specification is useful for, for example, use of a semiconductor device used for a power converter. Especially, it is useful for use of a power semiconductor device to be installed on an on-vehicle power converter, a power converter for industrial equipment, or the like.

What is claimed is:

1. A semiconductor device that includes a main region, a sense region, and a separation region electrically isolating the main region and the sense region, the semiconductor device comprising:
   a first conductivity type semiconductor substrate;
   a first semiconductor layer positioned on the main surface of the semiconductor substrate;
   a plurality of main cells disposed in the main region of the semiconductor substrate and connected in parallel to each other;
   a plurality of sense cells disposed in the sense region of the semiconductor substrate and connected in parallel to each other;
   a source electrode of which at least a portion is disposed in the main region; and
   a sense electrode of which at least a portion is disposed in the sense region,
   wherein each of the plurality of main cells and each of the plurality of sense cells include,
      a second conductivity type body region disposed within the first semiconductor layer and abutting a surface of the first semiconductor layer,
      a first conductivity type source region positioned within the body region,
      a first conductivity type drift region disposed in a region other than the body region and other than the source region among the first semiconductor layer,
      a gate insulating film disposed in the first semiconductor layer,
      a gate electrode disposed in the gate insulating film, and
      a drain electrode disposed in a rear surface side of the semiconductor substrate,
   the source region of each of the plurality of main cells is electrically connected to the source electrode,
   the source region of each of the plurality of sense cells is electrically connected to the sense electrode,
   the separation region includes
      a plurality of separation body regions which are second conductivity type separation body regions disposed within the first semiconductor layer and abutting the surface of the first semiconductor layer, and include a first separation body region electrically connected to the source electrode and a second separation body region electrically connected to the sense electrode, and
      a barrier region disposed between two adjacent separation body regions among the plurality of separation body regions, within the first semiconductor layer and abuts the surface of the first semiconductor layer, and
   the barrier region contains first conductivity type impurities with a concentration higher than a concentration of first conductivity type impurities of the drift region.

2. The semiconductor device of claim 1, further comprising:
   a highly-impurity-concentrated first conductivity type semiconductor layer which is on the first semiconductor layer and is disposed to abut on at least a portion of the barrier region,
   wherein the highly-impurity-concentrated first conductivity type semiconductor layer contains the first conductivity type impurities with a concentration higher than the concentration of first conductivity type impurities of the drift region.

3. The semiconductor device of claim 1, wherein an impurity concentration of the barrier region is greater than or equal to $1 \times 10^{16}$ cm$^{-3}$ and less than or equal to $1 \times 10^{18}$ cm$^{-3}$.

4. The semiconductor device of claim 1, wherein, when viewed from a normal direction to the main surface of the semiconductor substrate, the barrier region is positioned closer to the sense region than to the main region.

5. The semiconductor device of claim 1, further comprising:
a junction field effect transistor(JFET) region disposed between the body regions in two adjacent sense cells among the plurality of sense cells or between the body regions in two adjacent main cells among the plurality of main cells and the JFET abutting on the body regions,
wherein a concentration profile of the first conductivity type impurities of the JFET region in a depth direction is equal to the concentration profile of the first conductivity type impurities of the barrier region in a depth direction.

6. The semiconductor device of claim 1, wherein when viewed from a normal direction to the main surface of the semiconductor substrate, the plurality of sense cells and the plurality of main cells are two-dimensionally arranged in the first direction and a second direction intersecting with the first direction,
the semiconductor device further comprises a plurality of cell rows, the plurality of cell rows being arranged in the second direction, and
each of the plurality of cell rows includes a main cell row comprising of the main cells arranged in the first direction, a sense cell row comprising of the sense cells arranged in the first direction, the first separation body region, the barrier region, and the second separation body region, the first separation body region, the barrier region, and the second separation body region being positioned between the main cell row and the sense cell row.

7. The semiconductor device of claim 6, wherein the plurality of cell rows include a first cell row and a second cell row adjacent to each other in the second direction, and
the barrier region includes
first portions respectively disposed within the first cell row and the second cell row, and
second portions disposed between the first cell row and the second cell row and connecting the first portion of the first cell row and the first portion of the second cell row.

8. The semiconductor device of claim 6, wherein the plurality of separation body regions further include at least one third separation body region disposed between the first separation body region and the second separation body region,
the separation region further includes another barrier region, and
the barrier region and the other barrier region are disposed between the main cell row and the sense cell row by sandwiching at least one third separation body region between the barrier regions, in each of the plurality of cell rows.

9. The semiconductor device of claim 8, wherein the plurality of cell rows include a first cell row and a second cell row adjacent to each other in the second direction, and
the barrier region includes
first portions respectively disposed within the first cell row and the second cell row, and
third portions disposed between the first cell row and the second cell row and connecting the first portion of the first cell row and the other barrier region.

10. The semiconductor device of claim 1, wherein when viewed from a normal direction to the main surface of the semiconductor substrate, the barrier region is disposed to surround one separation body region of the plurality of separation body regions.

11. The semiconductor device of claim 2, wherein an impurity concentration of the highly-impurity-concentrated first conductivity type semiconductor layer is greater than or equal to $1 \times 10^{17}$ cm$^{-3}$ and less than or equal to $1 \times 10^{19}$ cm$^{-3}$.

12. The semiconductor device of claim 1, wherein concentration profiles of second conductivity type impurities in a depth direction of the body region and a depth direction of the separation body region are equal to each other.

13. The semiconductor device of claim 1, wherein the first semiconductor layer is a silicon carbide semiconductor layer.

14. A semiconductor device that includes a main region, a sense region, and a separation region electrically isolating the main region and the sense region, the semiconductor device comprising:
a first conductivity type semiconductor substrate;
a first semiconductor layer positioned on the main surface of the semiconductor substrate;
a plurality of main cells disposed in the main region of the semiconductor substrate and connected in parallel to each other;
a plurality of sense cells disposed in the sense region of the semiconductor substrate and connected in parallel to each other;
a source electrode of which at least a portion is disposed in the main region; and
a sense electrode of which at least a portion is disposed in the sense region,
wherein each of the plurality of main cells and each of the plurality of sense cells include,
a second conductivity type body region disposed within the first semiconductor layer and abutting a surface of the first semiconductor layer,
a first conductivity type source region positioned within the body region,
a first conductivity type drift region disposed in a region other than the body region and other than the source region among the first semiconductor layer,
a first conductivity type channel layer disposed to abut at least the body region on the first semiconductor layer,
a gate insulating film disposed in the second channel layer,
a gate electrode disposed in the gate insulating film, and
a drain electrode disposed in a rear surface side of the semiconductor substrate,
the source region of each of the plurality of main cells is electrically connected to the source electrode,
the source region of each of the plurality of sense cells is electrically connected to the sense electrode, the separation region includes
- a plurality of separation body regions which are second conductivity type separation body regions disposed within the first semiconductor layer and abutting the surface of the first semiconductor layer, and include a first separation body region electrically connected to the source electrode and a second separation body region electrically connected to the sense electrode, and
- a first conductivity type region positioned between two adjacent separation body regions among the plurality of separation body regions, and
- a highly-impurity-concentrated first conductivity type semiconductor layer disposed in the first conductivity type region and containing first conductivity type impurities with a concentration higher than a concentration of first conductivity type impurities of the first conductivity type region.

15. The semiconductor device of claim 14,
wherein an impurity concentration of the highly-impurity-concentrated first conductivity type semiconductor layer is greater than or equal to $1 \times 10^{17}$ cm$^{-3}$ and less than or equal to $1 \times 10^{19}$ cm$^{-3}$.

16. The semiconductor device of claim 14,
wherein the highly-impurity-concentrated first conductivity type semiconductor layer and the channel layer are connected to each other to constitute a second semiconductor layer.

17. The semiconductor device of claim 14,
wherein a concentration profile of second conductivity type impurities of the body region in a depth direction is equal to the concentration profile of the second conductivity type impurities of a separation body region in the depth direction.

18. The semiconductor device of claim 14,
wherein the first semiconductor layer is a silicon carbide semiconductor layer.

* * * * *